(12) United States Patent
Sugie et al.

(10) Patent No.: US 10,109,853 B2
(45) Date of Patent: Oct. 23, 2018

(54) ACTIVE MATERIAL EXCELLING IN HIGH-VOLTAGE CHARACTERISTICS

(71) Applicant: KABUSHIKI KAISHA TOYOTA JIDOSHOKKI, Kariya-shi, Aichi (JP)

(72) Inventors: Tsukasa Sugie, Kariya (JP); Dai Matsushiro, Kariya (JP); Masanori Harata, Kariya (JP); Takefumi Fukumoto, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 502 days.

(21) Appl. No.: 14/762,299

(22) PCT Filed: Jan. 24, 2014

(86) PCT No.: PCT/JP2014/000361
§ 371 (c)(1),
(2) Date: Jul. 21, 2015

(87) PCT Pub. No.: WO2014/115559
PCT Pub. Date: Jul. 31, 2014

(65) Prior Publication Data
US 2015/0357641 A1    Dec. 10, 2015

(30) Foreign Application Priority Data

Jan. 25, 2013 (JP) .................. 2013-011626
Feb. 8, 2013 (JP) .................. 2013-022849

(Continued)

(51) Int. Cl.
*H01M 4/38* (2006.01)
*H01M 4/131* (2010.01)
(Continued)

(52) U.S. Cl.
CPC ............ *H01M 4/38* (2013.01); *C01G 53/006* (2013.01); *C01G 53/50* (2013.01); *C30B 19/12* (2013.01);
(Continued)

(58) Field of Classification Search
None
See application file for complete search history.

(56) References Cited

U.S. PATENT DOCUMENTS

2003/0082448 A1   5/2003   Cho et al.
2006/0281005 A1  12/2006   Cho et al.
(Continued)

FOREIGN PATENT DOCUMENTS

JP    10-079251 A    3/1998
JP    2001-196063 A  7/2001
(Continued)

OTHER PUBLICATIONS

International Search Report of PCT/JP2014/000361 dated Apr. 22, 2014.
(Continued)

*Primary Examiner* — Alix E Eggerding
(74) *Attorney, Agent, or Firm* — Sughrue Mion, PLLC

(57) ABSTRACT

An active material expressed by a general formula; $Li_aNi_bCo_cMn_dD_eO_f$ (where $0.2 \leq$ "a"$\leq 1$, "b"+"c"+"d"+"e"=1, $0 \leq$"e"$<1$, "D" is at least one element selected from the group consisting of Li, Fe, Cr, Cu, Zn, Ca, Mg, Zr, S, Si, Na, K and Al, and $1.7 \leq$"f"$\leq 2.1$) includes a high manganese portion, which is made of a metallic oxide including Ni, Co and Mn at least and of which the composition ratio between Ni, Co and Mn is expressed by Ni:Co:Mn=b2:c2:d2 (note that "b2"+"c2"+"d2"=1, 0<"b2"<1, 0<"c2"<"c", and "d"<"d2"<1), in a superficial layer thereof.

6 Claims, 6 Drawing Sheets

○ Cobalt
● Nickel
⊕ Manganese

(30) Foreign Application Priority Data

Feb. 25, 2013 (JP) ................ 2013-034835
Nov. 21, 2013 (JP) ................ 2013-240796

(51) Int. Cl.

| | |
|---|---|
| *H01M 10/0525* | (2010.01) |
| *C30B 19/12* | (2006.01) |
| *H01M 4/505* | (2010.01) |
| *H01M 4/525* | (2010.01) |
| *C01G 53/00* | (2006.01) |
| *H01M 4/36* | (2006.01) |
| *H01M 4/02* | (2006.01) |

(52) U.S. Cl.

CPC ........... *H01M 4/131* (2013.01); *H01M 4/366* (2013.01); *H01M 4/505* (2013.01); *H01M 4/525* (2013.01); *H01M 10/0525* (2013.01); *C01P 2002/72* (2013.01); *C01P 2004/03* (2013.01); *C01P 2004/80* (2013.01); *C01P 2006/40* (2013.01); *H01M 2004/028* (2013.01); *H01M 2220/20* (2013.01)

(56) References Cited

U.S. PATENT DOCUMENTS

| | | | |
|---|---|---|---|
| 2009/0068561 A1 | 3/2009 | Sun et al. | |
| 2010/0183922 A1 | 7/2010 | Cho et al. | |
| 2010/0316910 A1 | 12/2010 | Kajiyama et al. | |
| 2012/0034503 A1 | 2/2012 | Toyama et al. | |
| 2012/0134914 A1* | 5/2012 | Paulsen | H01B 1/08 423/594.15 |
| 2012/0248388 A1* | 10/2012 | Nagai | H01M 4/505 252/519.15 |
| 2013/0202966 A1 | 8/2013 | Yu et al. | |
| 2014/0045067 A1* | 2/2014 | Cho | H01M 4/485 429/220 |

FOREIGN PATENT DOCUMENTS

| | | |
|---|---|---|
| JP | 2003-007299 A | 1/2003 |
| JP | 2004-087487 A | 3/2004 |
| JP | 2004-356034 A | 12/2004 |
| JP | 2006-127932 A | 5/2006 |
| JP | 2009-137834 A | 6/2009 |
| JP | 2009-525578 A1 | 7/2009 |
| JP | 2011-028999 A | 2/2011 |
| JP | 2012-038534 A | 2/2012 |
| WO | 2011/087309 A2 | 7/2011 |
| WO | 2012/093797 A2 | 7/2012 |

OTHER PUBLICATIONS

Written Opinion of the International Searching Authority of PCT/JP2014/000361 dated Apr. 22, 2014.

* cited by examiner

○ Cobalt
● Nickel
⊕ Manganese

Fig. 5

| No. | a | b | c | d | e | f | g | h | I | Averaged Value "n" |
|---|---|---|---|---|---|---|---|---|---|---|
| 1 | 1004416 | 942847.3 | 826106.9 | 1015825 | 950323.4 | 828917.8 | 966322.3 | 1021746 | 811583.3 | 0.818 |
|   |   |   | 0.822 | 0.813 | 0.813 | 0.816 | 0.858 | 0.811 | 0.794 |   |
| 2 | 772486.7 | 939898.6 | 1041617 | 7479298 | 974281.3 | 995499.6 | 734896 | 1048845 | 1016559 | 0.724 |
|   |   |   | 0.742 | 0.718 | 0.718 | 0.751 | 0.738 | 0.701 | 0.701 |   |
| 3 | 1088585 | 1049168 | 988495.1 | 12072269 | 1087649 | 962118.8 | 1053191 | 1039713 | 930210 | 0.861 |
|   |   |   | 0.908 | 0.819 | 0.819 | 0.797 | 0.885 | 0.914 | 0.883 |   |
| 4 | 1276671 | 1109466 | 12277605 | 11699985 | 1030541 | 1152691 | 1202514 | 1002888 | 1124953 | 0.860 |
|   |   |   | 0.869 | 0.904 | 0.839 | 0.881 | 0.857 | 0.834 | 0.834 |   |
| 5 | 1151562 | 1122564 | 11144826 | 11379933 | 1117910 | 1134818 | 1105468 | 1089024 | 1118989 | 0.974 |
|   |   |   | 0.975 | 0.981 | 0.976 | 0.982 | 0.974 | 0.960 | 0.973 |   |
| 6 | 1250368 | 1282228 | 11158257 | 1236107 | 1210061 | 1137909 | 1112338 | 1270323 | 1201675 | 0.904 |
|   |   |   | 0.902 | 0.902 | 0.935 | 0.921 | 0.919 | 0.876 | 0.876 |   |
| 7 | 1422841 | 1410671 | 13213394 | 1405076 | 1253045 | 1382222 | 1330768 | 1352567 | 1374558 | 0.927 |
|   |   |   | 0.929 | 0.937 | 0.892 | 0.892 | 0.907 | 0.963 | 0.968 |   |

12th Ex.

3rd Comp. Ex.

ACTIVE MATERIAL EXCELLING IN HIGH-VOLTAGE CHARACTERISTICS

CROSS REFERENCE TO RELATED APPLICATIONS

This is a National Stage of International Application No. PCT/JP2014/000361 filed Jan. 24, 2014, claiming priority based on Japanese Patent Application No. 2013-011626 filed Jan. 25, 2013, Japanese Patent Application No. 2013-022849 filed Feb. 8, 2013, Japanese Patent Application No. 2013-034835 filed Feb. 25, 2013, and Japanese Patent Application No. 2013-240796 filed Nov. 21, 2013, the contents of all of which are incorporated herein by reference in their entirety.

TECHNICAL FIELD

The present invention relates to a lithium composite metallic oxide having a lamellar rock-salt structure, and expressed by a general formula, $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$).

BACKGROUND ART

Various materials have been known to be used for active materials in nonaqueous-system secondary batteries. Among the materials, lithium composite metallic oxides, which have a lamellar rock-salt structure and are expressed by a general formula, $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), have been used universally as active materials for lithium-ion secondary batteries.

However, when a lithium composite metallic oxide expressed by the aforementioned general formula is used as an active material in a high-capacity secondary battery driven or operated with a high voltage required for on-vehicle secondary battery, for instance, the lithium composite metallic oxide has been unable to keep the standard for satisfying a capacity maintained rate of the secondary battery, because the resistance of the material to the high voltage has been insufficient.

Consequently, investigations have been actively carried out recently to upgrade various materials to be used as active materials in the resistance to high voltage. In making the investigations, the following three methods have been proposed commonly.
1) doping an active material with an element of different species
2) forming a protective film on the surface of an active material
3) changing the composition of an active material in the superficial layer The method according to above-mentioned 1), and an advantageous effect thereof are concretely explained below. Doping an active material with an element, such as Al or Zr, which has not been present in the active material, enables degradations of the active material accompanied by charging and discharging operations, namely, accompanied by the absorption and release of Li, to be inhibitable.

The method according to above-mentioned 2), and an advantageous effect thereof are concretely explained below. As following Patent Application Publication No. 1 discloses, making a protective film on the surface of an active material with a salt of phosphoric acid, and preventing the active material from contacting directly with an electrolytic solution enable degradations of the active material resulting primarily from contacting with the electrolytic solution to be inhibitable.

The method according to above-mentioned 3), and an advantageous effect thereof are concretely explained below. Following Patent Application Publication No. 2 discloses an active material with an increased Al composition in an obtainable superficial layer thereof by coating the active material on the surface with an Al compound and then heat treating the active material with the Al compound coated thereon.

Moreover, disclosures on crystalline heterogeneous strains in lithium composite metallic oxides are available in Patent Application Publication Nos. 3 through 6 mentioned below.

Patent Application Publication No. 3 sets forth controlling crystalline heterogeneous strains in a lithium composite metallic oxide during a 4-V-class charging/discharging cycle. The publication points out that, when crystalline heterogeneous strains in a lithium composite metallic oxide are low, namely, when the crystallinity is high, slight collapses in the crystal structure results in greatly hindering the diffusion of lithium ions at the time of battery reactions and thereby a capacity maintained rate becomes low. Accordingly, upgrading the capacity maintained rate at the time of a 4-V-class charging/discharging mode or operation has been sought for. Moreover, in Patent Publication Literature No. 3, crystalline heterogeneous strains in a lithium composite metallic oxide are controlled by adding an element of different species to the fundamental constituent elements of the lithium composite metallic oxide. Accordingly, the lithium composite metallic oxide has been feared of being declined in the capacity to such an extent that the different-species element is added. From a viewpoint of the capacity, not adding the different-species element to the lithium composite metallic oxide is more preferable.

Patent Application Publication No. 4 sets forth that, in a hexagonal rock-salt-type crystal structure, such strains occur as stretching in the c-axis direction because repulsion forces occur between the oxygen atoms. The publication points out that not only the strains have an influence on the diffusion distance of Li and the stabilization of crystal structure, but also the strains result in making a high-capacity positive-electrode active material excelling in the cyclic durability obtainable.

Patent Application Publication No. 5 sets forth that defects and strains in the crystal lattice of an active material relieve expansive or contractive stresses in the lattice accompanied by charging/discharging mode or operations and the relieved stresses result in improving the active material in the cyclic longevity.

Patent Application Publication No. 6 sets forth that, even when a secondary battery is charged with a charge cut-off voltage of from 4.2 V up to 4.5 V against the lithium potential, setting a c-axis variation rate of the positive-electrode active material at a predetermined value or less leads to making the secondary battery upgradeable considerably in the cyclability.

PATENT LITERATURE

Patent Application Publication No. 1: Japanese Unexamined Patent Publication (KOKAI) Gazette No. 2006-127932;

Patent Application Publication No. 2: Japanese Unexamined Patent Publication (KOKAI) Gazette No. 2001-196063;

Patent Application Publication No. 3: Japanese Unexamined Patent Publication (KOKAI) Gazette No. 10-079251;

Patent Application Publication No. 4: Japanese Unexamined Patent Publication (KOKAI) Gazette No. 2011-028999;

Patent Application Publication No. 5: Japanese Unexamined Patent Publication (KOKAI) Gazette No. 2004-087487; and Patent Application Publication No. 6: Japanese Unexamined Patent Publication (KOKAI) Gazette No. 2004-356034

SUMMARY OF THE INVENTION

Technical Problem

Since the three methods according to aforementioned 1) through 3) have drawbacks given below, respectively, the methods have not necessarily arrived at obtaining a satisfiable active material yet.

The following are the drawbacks of the method according to aforementioned 1): Since absorbable and releasable Li in the active material has been decreased, in effect, by doping the active material with the different-species element not being driven or operated electrochemically, the Li storage capacity in the active material decreases and thereby the capacity of a lithium-ion secondary battery, per se, declines.

A drawback of the method according to aforementioned 2) is that the protective film formed on the active-material surface turns into an electric resistance to make currents less likely to flow. Although making the protective film into an extremely-thin film is good to overcome the drawback, establishing such a technology is very difficult at the level of industrialization.

The method according to aforementioned 3) is desirable theoretically, because the method does not likely to cause a capacity to decline, the drawback of the method according to aforementioned 1), and because any electrically-resistive protective film, the drawback of the method according to aforementioned 2), is not formed at all. However, according to the disclosures of Patent Application Publication No. 2, since the method according to aforementioned 3) is virtually a technology of doping the active-material superficial layer with Al, not only the same drawbacks as 1) are observed, but also no marked advantageous effect is observed when comparing the active material of which the Al composition in the active-material superficial layer is increased by the treatment method set forth in the publication with another active material to which the treatment is not carried out at all.

That is, in the technologies of modifying the active materials, an active material fully satisfying the standard is not necessarily said to be obtainable.

The present invention is made in view of such circumstances. An object of the present invention is to provide a lithium composite metallic oxide usable as an active material for lithium-ion secondary battery, the active material keeping a satisfactory Li storage capacity, namely, exhibiting a satisfactory capacity maintained rate, even when being employed for secondary batteries driven or operated with a high voltage.

Solution to Problem

As a result of earnest investigations by the present inventors, the present inventors came to know that, when carrying out a specific treatment (hereinafter, being sometimes referred to as a "specific treatment," or a "treatment according to the present invention") to materials having a lamellar rock-salt structure and expressed by a general formula, $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), post-treatment lithium composite metallic oxides had an increased Mn composition ratio in the outermost superficial layer, regardless of the fact that Mn had not been added by the treatment. Moreover, the present inventors came to know that the post-treatment lithium composite metallic oxides had a changed crystal structure in the superficial layer. In addition, the present inventors came to know that the post-treatment lithium composite metallic oxides had changed heterogeneous strains in the lamellar rock-salt crystal structure. An Mn composition ratio in the outermost superficial layer increased by the aforementioned specific treatment, a crystal structure in the superficial layer changed by the specific treatment, and heterogeneous strains in the lamellar rock-salt crystal structure changed by the specific treatment are defined as "states changed by surface modification" in the present specification. Moreover, the changes are called as "surface modifications" generically.

And, the present inventors discovered that, when a lithium composite metallic oxide after the treatment according to the present invention (hereinafter, being sometimes referred to as an "active material according to the present invention," or a "lithium composite metallic oxide according to the present invention") is used as an active material for lithium-ion secondary battery, the secondary battery has a suitably maintained capacity. In particular, the present inventors discovered that, even when the secondary battery is driven or operated with a high voltage at around 4.5 V, the secondary battery exhibits an excellent capacity maintained rate.

That is, an active material according to the present invention has a lamellar rock-salt structure, and is expressed by a general formula, $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$); and the present active material comprises a high manganese portion, which is made of a metallic oxide including Ni, Co and Mn at least and of which the composition ratio between Ni, Co and Mn is expressed by Ni:Co:Mn=b2:c2:d2 (note that "b2"+"c2"+"d2"=1, $0 < "b2" < 1$, $0 < "c2" < "c"$, and $"d" < "d2" < 1$), in a superficial layer thereof.

A lithium-ion secondary battery using the present active material exhibits an excellent capacity maintained rate, because the following reasons are inferred from a viewpoint of the composition in the superficial layer.

When an active material, which belongs to a lamellar rock-salt type and is expressed by the general formula: $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), is used for a lithium-ion secondary battery, the transition metals, Ni, Co and Mn, in the general formula are believed to have the following roles.

Ni is the most active at the time of Li charging/discharging reactions. Although the greater the Ni content is within an active material the more the capacity increases, the greater the Ni content is within an active material the more the active material is likely to degrade contrarily.

Mn is the most inactive at the time of Li charging/discharging reactions. Although the greater the Mn content is within an active material the more the capacity declines, the greater the Mn content is within an active material the more the active material excels in the stability of the crystal structure contrarily.

Co exhibits an intermediate activity between the activities of Ni and Mn at the time of Li charging/discharging reactions. The Co content within an active material also affects the capacity and stability to an intermediate extent between Ni and Mn.

If so, when the Mn composition ratio in the active-material superficial layer becomes high compared with an Mn composition ratio inside the active material, the stability of the active-material superficial layer, which undergoes the inflow and outflow of Li actively and contacts with an electrolyte directly, comes to upgrade relatively. As a result, the active material comes to be inhibited from degrading. Note herein that, since the composition change in the active-material superficial layer is slight extremely when viewing the active material as a whole, minimizing the activity decline, which results from heightening the Mn composition ratio in the active-material superficial layer, is made possible at the time of Li charging/discharging reactions.

Moreover, another active material according to the present invention is an active material having a lamellar rock-salt structure and expressed by a general formula, $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$); and the active material comprises a first superlattice-structure portion in an active-material superficial layer thereof, the first superlattice-structure portion exhibiting a seven-set averaged value "n" of intensity ratios being less than 0.9 when the intensity ratios are computed in seven sets by dividing a minimum value of three continuous integrated intensities of an image, which is obtained by observing identical 3b sites in said lamellar rock-salt structure from a <1-100> orientation with a high-angle scattering annular dark-field scanning transmission electron microscope, by a maximum value of the three continuous integrated intensities.

In addition, still another active material according to the present invention is an active material having a lamellar rock-salt structure, and expressed by general formula, $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$); and the active material comprises a second superlattice-structure portion in an active-material superficial layer thereof, wherein three arbitrary continuous integrated strengths of an image, which is obtained by observing identical 3b sites in said lamellar rock-salt structure from a <1-100> orientation with a high-angle scattering annular dark-field scanning transmission electron microscope, are expressed in the following order: p1, p2, and q (where $0.9 \times "p1" \leq "p2" \leq 1.1 \times "p1"$, "q" is $"q" < 0.9 \times "p2"$ when $"p1" \leq "p2"$, or "q" is $"q" < 0.9 \times "p1"$ when $"p2" \leq "p1"$).

Additionally, a further active material according to the present invention is an active material having a lamellar rock-salt structure, and expressed by a general formula, $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$); and the active material comprises a third superlattice-structure portion in an active-material superficial layer thereof, the third superlattice-structure portion satisfying both of the conditions for the first superlattice-structure portion as set forth above and the conditions for the second superlattice-structure portion as set forth above.

Note herein that, compared with the interior of the active material, the aforementioned first superlattice-structure portion, second superlattice-structure portion and third superlattice-structure portion, which exist in the active-material superficial layer, excel in the resistance property against the degradations accompanied by charging/discharging modes or operations. To be concrete, the aforementioned first through third superlattice-structure portions excel in the structural stability when Li is pulled from out of the present lithium composite metallic oxide at the time of charging a lithium-ion secondary battery, and excel in the corrosion resistance against electrolytes for lithium-ion secondary battery. Thus, the stability of the active-material superficial layer, which undergoes the inflow and outflow of Li actively and contacts with an electrolyte directly, comes to upgrade relatively. As a result, the present active material comes to be inhibited from degrading.

And, a lithium composite metallic oxide according to the present invention is a lithium composite metallic oxide having a lamellar rock-salt crystal structure, and expressed by a general formula: $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$); and said lamellar rock-salt crystal structure comprises a heterogeneous strain in a c-axis direction of said lamellar rock-salt crystal structure.

In the light of the aforementioned disclosures of Patent Application Publication Nos. 3 through 6, a secondary battery, which uses as a positive-electrode active material the present lithium composite metallic oxide comprising a heterogeneous strain in a c-axis direction of the lamellar rock-salt crystal structure, is expectable to have excellent cyclability.

Advantageous Effects of the Invention

The present lithium composite metallic oxide keeps a satisfactory Li storage capacity, namely, exhibits a satisfactory capacity maintained rate, even when being employed for a secondary battery driven or operated with a high voltage.

BRIEF DESCRIPTION OF THE DRAWINGS

FIG. 5 is data on integrated intensities of the image shown in FIG. 4;

DESCRIPTION OF THE EMBODIMENTS

Figure 1:
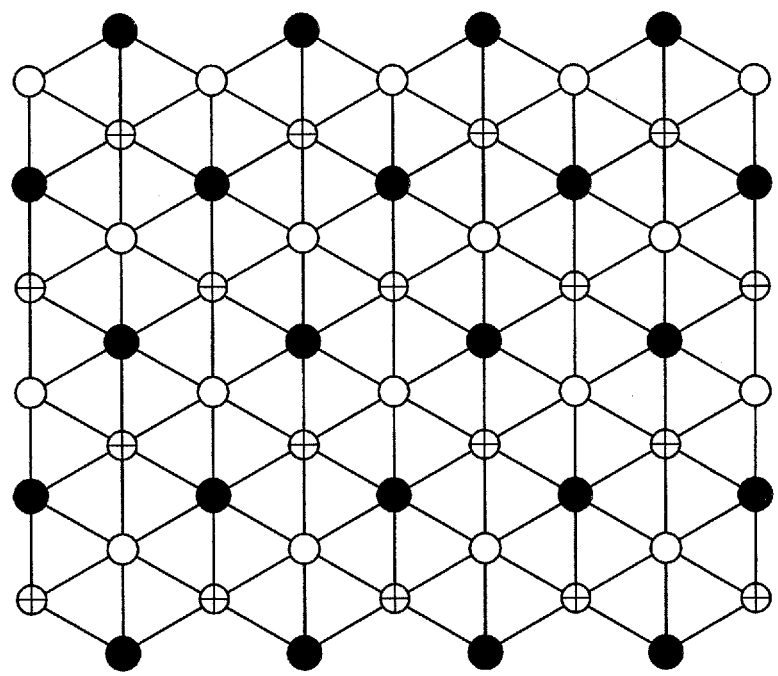
FIG. 1 is a schematic diagram of an ordinary superlattice plane of $Ni_{1/3}Co_{1/3}Mn_{1/3}$ in which a plane constituted of a lamellar-rock-salt-structure 3b site is represented as a [$\sqrt{3} \times \sqrt{3}$]R30° type.

Some of best modes for executing the present invention are hereinafter described. Note that, unless otherwise specified, numerical ranges, namely, "from 'x' to 'y'" set forth in the present description, involve the lower limit, "x," and the upper limit, "y" in the ranges. Moreover, the other numerical ranges are composable by arbitrarily combining any two of the upper-limit values and lower-limit values, involving the other numeric values enumerated in examples as well. In addition, selecting numeric values arbitrarily from within the ranges of numeric values enables other upper-limit and lower-limit numerical values to be set.

An active material according to the present invention has a lamellar rock-salt structure, and is expressed by a general formula, $Li_aNi_bCo_cMn_dD_eO_f$ (where $0.2 \leq$ "a"$\leq 1$, "b"+"c"+"d"+"e"=1, $0 \leq$ "e"$<1$, "D" is at least one element selected from the group consisting of Li, Fe, Cr, Cu, Zn, Ca, Mg, Zr, S, Si, Na, K and Al, and $1.7 \leq$ "f"$\leq 2.1$), and the present active material comprises a high manganese portion, which is made of a metallic oxide including Ni, Co and Mn at least and of which the composition ratio between Ni, Co and Mn is expressed by Ni:Co:Mn=b2:c2:d2 (note that "b2"+"c2"+"d2"=1, $0<$"b2"$<1$, $0<$"c2"$<$"c", and "d"$<$"d2"$<1$), in the superficial layer.

In the general formula: $Li_aNi_bCo_cMn_dD_eO_f$ (where $0.2 \leq$ "a"$\leq 1$, "b"+"c"+"d"+"e"=1, $0 \leq$ "e"$<1$, "D" is at least one element selected from the group consisting of Li, Fe, Cr, Cu, Zn, Ca, Mg, Zr, S, Si, Na, K and Al, and $1.7 \leq$ "f"$\leq 2.1$), the values of "b," "c" and "d" are not at all restricted especially, as far as the values satisfy the aforementioned conditions. However, allowable values of "b", "c" and "d" fall in such ranges as $0 \leq$ "b"$\leq 1$, $0 \leq$ "c"$\leq 1$ and $0 \leq$ "d"$\leq 1$, respectively; and a more allowable values thereof fall in such ranges as $0<$"b"$<1$, $0<$"c"$<1$ and $0<$"d"$<1$, respectively. Moreover, at least one of "b," "c" and "d" falls preferably in such a range as $0<$"b"$<80/100$, $0<$"c"$<70/100$ and $10/100<$"d"$<1$, respectively; more preferably in such a range as $10/100<$"b"$<68/100$, $12/100<$"c"$<60/100$ and $20/100<$"d"$<68/100$, respectively; and much more preferably falls in such a range as $25/100<$"b"$<60/100$, $15/100<$"c"$<50/100$ and $25/100<$"d"$<60/100$, respectively. In addition, especially preferable ranges are $1/3 \leq$ "b"$\leq 50/100$, $20/100 \leq$ "c"$\leq 1/3$ and $30/100 \leq$ "d"$\leq 1/3$, respectively. Moreover, the most preferable values of "b," "c" and "d" are as follows: "b"=1/3, "c"=1/3 and "d"=1/3; or "b"=50/100, "c"=20/100 and "d"=30/100.

Permissible values of "a," "e" and "f" are numerical values falling within the ranges prescribed by the general formula, and are exemplifiable as follows: "a"=1, "e"=0 and "f"=2.

The high manganese portion is hereinafter explained.

The high manganese portion is a metallic oxide, which includes Ni, Co and Mn at least, and of which the composition ratio between Ni, Co and Mn is expressed by Ni:Co:Mn=b2:c2:d2 (note that "b2"+"c2"+"d2"=1, $0<$"b2"$<1$, $0<$"c2"$<$"c", and "d"$<$"d2"$<1$).

The values of aforementioned "b2," "c2" and "d2" are not restricted at all, as far as the values satisfy the aforementioned conditions.

A preferable value of "b2" falls in such a range as $0<$"b2"$<80/100$; a more preferable value thereof falls in such a range as $20/100<$"b2"$<70/100$; and a much more preferable value thereof falls in such a range as $25/100<$"b2"$<50/100$. Alternatively, a preferable value of "b2" falls in such a range as $0.5\times$"b"$<$"b2"$<2\times$"b"; a more preferable value thereof falls in such a range as $0.8\times$"b"$<$"b2"$<1.4\times$"b"; and a much more preferable value thereof falls in such a range as $0.85\times$"b"$<$"b2"$<1.1\times$"b". An especially preferable value of "b2" falls in such a range as $0.88\times$"b"$<$"b2"$\leq 0.96\times$"b".

A more preferable value of "c2" falls in such a range as $5/100<$"c2"$<$"c"; and a much more preferable value thereof falls in such a range as $10/100<$"c2"$<25/100$. Alternatively, a preferable value of "c2" falls in such a range as $0.2\times$"c"$<$"c2"$<0.9\times$"c"; a more preferable value thereof falls in such a range as $0.5\times$"c"$<$"c2"$<0.88\times$"c"; a much more preferable value thereof falls in such a range as $0.63\times$"c"$\leq$ "c2"$\leq 0.85\times$"c".

A more preferable value of "d2" falls in such a range as $35/100<$"d2"$<85/100$; and a much more preferable value thereof falls in such a range as $36/100<$"d2"$<65/100$. Moreover, another preferable value of "d2" falls in such a range as "d"$<$"d2"$<85/100$; another more preferable value thereof falls in such a range as "d"$<$"d2"$<75/100$; and another much more preferable value thereof falls in such a range as "d"$<$"d2"$<65/100$. In addition, still another preferable value of "d2" falls in such a range as "d"$<$"d2"$<2\times$"d"; still another more preferable value thereof falls in such a range as $1.1\times$"d"$<$"d2"$<1.5\times$"d"; and still another much more preferable value thereof falls in such a range as $1.2\times$"d"$<$"d2"$\leq 1.41\times$"d".

The phrase, "comprising a high manganese portion in the superficial layer," means that the high manganese portion exists in the superficial layer, regardless of the amount being more or less. As far as the high manganese portion exists in the superficial layer of an active material, the stability is kept for the active material, which is present more inside at least than is a location where the high manganese portion exists. As a result, the advantageous effect of maintaining the capacity is demonstrated. In view of maintaining the capacity, a preferable high manganese portion exists in the entire superficial layer of an active material.

The term, "superficial layer," means a layer including the outermost surface of the present active material. From the viewpoint of the stability of the present active material, a thickness of the superficial layer is said that the thicker the thickness is the more preferably the superficial layer is made. However, no practical problem arises, as far as the superficial layer has an enough thickness for preventing the contact between an electrolytic solution and the interior of an active material. Considering the likeliness of the progress of Li charging/discharging reactions, the thinner a thickness of the superficial layer is the more preferably the superficial layer is made. A thickness "t" (nm) of the superficial layer falls in such a range as 0<"t"<20, for instance. A preferable thickness "t" falls in such a range as 0.01<"t"<10; a more preferable thickness "t" falls in such a range as 0.1<"t"<5; a much more preferable thickness "t" falls in such a range as 1<"t"<3; and the most preferable thickness "t" falls in such a range as 1.5<"t"<2.5.

The high manganese portion is also allowed to scatter in the superficial layer, or is even permitted to exist as a layer of the high manganese portion. A thickness "$s_1$" (nm) of a layer of the high manganese portion falls in such a range as 0<"$s_1$"<20, for instance. A preferable thickness "$s_1$" falls in such a range as 0.01<"$s_1$"<10; a more preferable thickness "$s_1$" falls in such a range as 0.1<"$s_1$"<5; a much more preferable "$s_1$" falls in such a range as 1<"$s_1$"<3; and the most preferable thickness "$s_1$" falls in such a range as 1.5<"$s_1$"<2.5.

Moreover, a preferable high manganese portion exists within a range of 2 nm at least from the surface of an active material in a direction toward the center of the active material.

The high manganese portion exists in the superficial layer of the present active material. And, since the superficial layer accounts for a slight volume compared with the volume of the present active material, the composition of the high manganese portion does not have any influence virtually on the composition of an active material with the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1).

Next, the lamellar rock-salt structure is hereinafter explained.

The crystal structure of a lithium composite metallic oxide expressed by the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1), belongs to a rhombohedral system, has a threefold axis (which exhibits an inversion symmetry) and mirror-symmetry plane, and is expressed by the space group "R-3m". Note that, in the designation, "R-3m", "-3" expresses the number 3 to which an overline added. And, the lamellar rock-salt structure of a lithium composite metallic oxide with the aforementioned general formula comprises the 3a sites of a layer (or plane) including $Li_a$, the 3b sites of another layer (or plane) including $Ni_bCo_cMn_dD_e$, and the 6c sites of still another layer (or plane) including $O_f$, wherein the sites are repeated in the order of the 6c site, the 3b site, the 6c site, the 3a site, and so on. Note herein that the "3a site," the "3b site" and the "6c" site are designations expressed in accordance with the Wyckoff symbols.

The first through third superlattice-structure portions are hereinafter explained.

The term, a "first superlattice-structure portion," means a structure exhibiting a seven-set averaged value "n" of intensity ratios being less than 0.9 when the intensity ratios are computed in seven sets by dividing a minimum value of three continuous integrated intensities of an image, which is obtained by observing identical 3b sites in said lamellar rock-salt structure from a <1-100> orientation with a high-angle scattering annular dark-field scanning transmission electron microscope, by a maximum value of the three continuous integrated intensities. Note that, in the designation, "<1-100>", "−1" expresses the number 1 to which an overline added. The term, a "<1-100> orientation," is one of generalized expressions for the equivalent vectors of vectors expressing directions within a crystal by the Miller indices. Note herein that, in a crystal plane of the 3b site shown in FIG. 1, an orientation, which is inclined to the right by 30° from a line connecting nickel, cobalt and manganese in this order in a direction from the bottom toward the top, is given concretely as one of the <1-100> orientations in the 3b-site plane of a lamellar rock-salt structure. The aforementioned averaged value "n" is not at all restricted especially, as far as the value is less than 0.9. However, a preferable averaged value "n" is less than 0.86, a more preferable averaged value "n" is less than 0.82, and a much more preferable averaged value "n" is less than 0.80.

The term, a "second superlattice-structure portion," means a structure in which three arbitrary continuous integrated strengths of an image, which is obtained by observing identical 3b sites in said lamellar rock-salt structure from a <1-100> orientation with high-angle scattering annular dark-field scanning transmission electron microscope, are expressed in the following order: p1, p2, and q (where 0.9×"p1"≤"p2"≤1.1×"p1", "q" is "q"<0.9×"p2" when "p1"<"p2", or "q" is "q"<0.9×"p1" when "p2"≤"p1"). The values of aforementioned "p1," "p2" and "q" are not at all restricted especially, as far as the values fall in the above-described ranges, respectively. However, when "p1"≤"p2", a preferable value of "q" is "q"<0.85×"p2"; a more preferable value thereof is "q"<0.80×"p2"; and a much more preferable value thereof is "q"<0.75×"p2". Likewise, when "p2"<"p1", a preferable value of "q" is "q"<0.85×"p1"; a more preferable value thereof is "q"<0.80×"p1"; and a much more preferable value thereof is "q"<0.75×"p1".

Journal of The Electrochemical Society, 151 (10), pp. A1545-A1551 (2004) discloses a superlattice plane in the $Ni_{1/3}Co_{1/3}Mn_{1/3}$ crystal planes constituted of the 3b sites of a lamellar rock-salt structure in $LiNi_{1/3}Co_{1/3}Mn_{1/3}O_2$. According to the Wood's designation, the aforementioned $Ni_{1/3}Co_{1/3}Mn_{1/3}$ superlattice plane is representable as a [√3×√3]R30° type. FIG. 1 shows a schematic diagram of the $Ni_{1/3}Co_{1/3}Mn_{1/3}$ superlattice plane represented by a [√3×√3] R30° type.

Note that, in the subsequent descriptions, a superlattice plane, which is able to exist before a treatment according to the present invention, is referred to as an "ordinary superlattice plane."

The "high-angle scattering annular dark-field scanning transmission electron microscopy" is the so-called HAADF-STEM, and is referred to as a method in which a finely-tuned electron beam is projected onto a sample while scanning the sample, some of the transmission electrons scattering at high angles are detected with an annular detector, and integrated strengths of the detected electrons are displayed.

In the present invention, the crystal plane of an active material measured by the high-angle scattering annular dark-field scanning transmission electron microscopy is a metallic layer including Ni, Co and Mn, and is a plane corresponding to the super lattice plane according to the aforementioned literature.

When observing the [√3×√3]R30°-type $Ni_{1/3}Co_{1/3}Mn_{1/3}$ ordinary superlattice plane in $LiNi_{1/3}Co_{1/3}Mn_{1/3}O_2$ from a <1-100> orientation by the high-angle scattering annular dark-field scanning transmission electron microscopy and then computing strength ratios in seven sets by dividing a minimum value of three continuous integrated strengths obtained from an identical 3b-site in a lamellar rock-salt structure in an image, which is observed with a high-angle scattering annular dark-field scanning transmission electron microscope, by a maximum value of the three continuous integrated strengths, an averaged vale "n" of the seven sets is 0.9 or more and less than one. Moreover, when observing the same ordinary superlattice plane from a <1-100> orientation by the high-angle scattering annular dark-field scanning transmission electron microscopy, three arbitrary continuous integrated strengths, which are obtained from an identical 3b-site in the lamellar rock-salt structure in an image observed with a high-angle scattering annular dark-field scanning transmission electron microscope, are arranged in the following order: p1, p2 and p3 (where $0.9 \times$ "p1"≤"p2"≤$1.1 \times$"p1", $0.9 \times$"p1"≤"p3"≤$1.1 \times$"p1", $0.9 \times$"p2"≤"p3"≤$1.1 \times$"p2"). That is, in the [$\sqrt{3} \times \sqrt{3}$]R30°-type $Ni_{1/3}Co_{1/3}Mn_{1/3}$ ordinary superlattice plane in $LiNi_{1/3}Co_{1/3}Mn_{1/3}O_2$, no marked difference was appreciated in the integrated strengths observed in an identical 3b-site plane in the lamellar rock-salt structure. Hence, the aforementioned ordinary superlattice layer, and the first through third superlattice-structure portions according to the present invention are distinguished one another definitely. In the first through third superlattice-structure portions of the present active material, of the three continuous integrated strengths, the latter one strength is small compared with the two former strengths. In other words, the first through third superlattice-structure portions of the present active material are also said to exhibit an integrated-strength pattern in which the integrated-strength pattern obtained from the ordinary superlattice plane expressed as [$\sqrt{3} \times \sqrt{3}$]R30° type is disordered regularly.

The phrase, "comprising a first, second or third superlattice-structure portion in the active-material superficial layer," means that the first, second or third superlattice-structure portion exists, regardless of the amount being more or less. As far as the first, second or third superlattice-structure portion exists in the superficial layer of an active material, the stability is kept for the active material, which is present more inside at least than is a location where the first, second or third superlattice-structure portion exists. As a result, the advantageous effect of maintaining the capacity is demonstrated. In view of maintaining the capacity, a preferable first, second or third superlattice-structure portion exists in the entire superficial layer of an active material.

The term, "superficial layer," means a layer including a surface of the present active material. From the viewpoint of the stability of the present active material, a thickness of the superficial layer is said that the thicker the thickness is the more preferably the superficial layer is made. However, no practical problem arises, as far as the superficial layer has an enough thickness for preventing the contact between an electrolytic solution and the interior of an active material. Considering the likeliness of the progress of Li charging/discharging reactions, the thinner a thickness of the superficial layer is the more preferably the superficial layer is made. A thickness "t" (nm) of the superficial layer falls in such a range as 0.1<"t"<20, for instance. A preferable thickness "t" falls in such a range as 0.01<"t"<10; a more preferable thickness "t" falls in such a range as 0.1<"t"<5; a much more preferable thickness "t" falls in such a range as 1<"t"<3; and the most preferable thickness "t" falls in such a range as 1.5<"t"<2.5.

The first, second or third superlattice-structure portion is also allowed to scatter in the superficial layer, or is even permitted to exist as a layer of the first, second or third superlattice-structure portion. A thickness "$s_2$" (nm) of the layer of the first, second or third superlattice-structure portion falls in such a range as 0<"$s_2$"<20, for instance. A preferable thickness "$s_2$" falls in such a range as 0.01<"$s_2$"<10; a more preferable thickness "$s_2$" falls in such a range as 0.1<"$s_2$"<5; a much more preferable thickness "$s_2$" falls in such a range as 1<"$s_2$"<3; and the most preferable thickness "$s_2$" falls in such a range as 1.5<"$s_2$"<2.5.

The interior of the present active material is not restricted at all, as far as the interior is expressed by a general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1). A preferable interior thereof comprises a [$\sqrt{3} \times \sqrt{3}$]R30° type ordinary superlattice plane.

Figure 6:
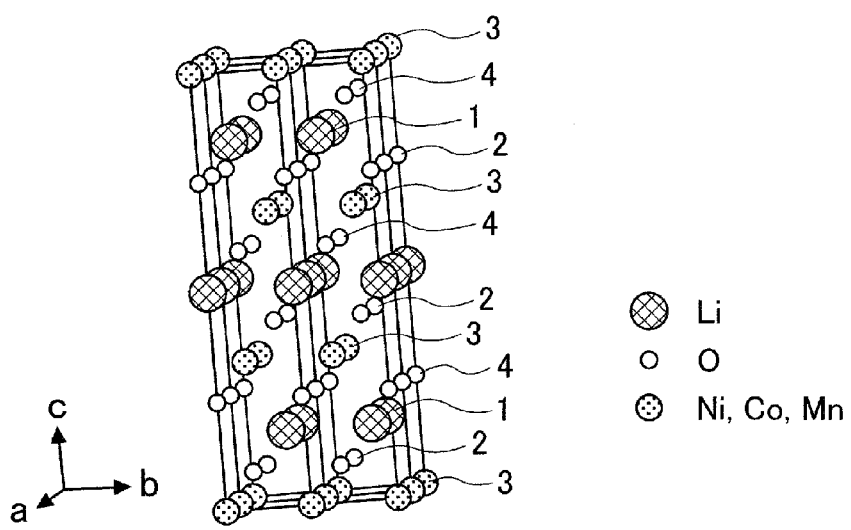
FIG. 6 is a schematic diagram of a lamellar rock-salt structure in a lithium composite metallic oxide according to the present invention.

Moreover, FIG. 6 schematically shows the lamellar rock-salt crystal structure of a lithium composite metallic oxide. As shown in FIG. 6, in the lamellar rock-salt crystal structure, an Li group 1, an O group 2, an (Ni, Mn, Co) group 3, and an O group 4 are formed lamellarly on the a-b plane formed between the a-axis and b-axis, respectively. In the c-axis direction, the Li group 1, the O group 2, the (Ni, Mn, Co) group 3, and the O group 4 are repeated in this order.

The lamellar rock-salt crystal structure of the present lithium composite metallic oxide comprises a heterogeneous strain $\eta_c$ in the crystalline c-axis direction, and a heterogeneous strain $\eta$ in the all-round direction. The heterogeneous strains are believed to be attributed to grain boundaries in the present lithium composite metallic oxide, defects like dislocations therein, or mismatches between the phase interfaces therein. Causing such uneven regions to occur within the crystals in a lithium composite metallic oxide leads to stabilizing the crystal structure. Accordingly, a secondary battery using the present lithium composite metallic oxide as a positive-electrode active material is believed to be able to enhance the capacity maintained rate, and to enhance the charging/discharging cyclability.

The c-axis-direction heterogeneous strain $\eta_c$, and the all-round-direction heterogeneous strain $\eta$ are computable from X-ray diffraction lines obtainable by analyzing a lithium composite metallic oxide with an X-ray diffraction apparatus. According to the Stokes-Wilson's law, there is a relationship defined by following Equation (1) between a heterogeneous strain $\eta$ in the crystal lattice of a lithium composite metallic oxide and an integrated width $\beta_j$ in the peak of X-ray diffraction lines resulting from the heterogeneous strain $\eta$.

$$\beta_j = 2\eta \tan \theta \qquad (1)$$

(Here, $\theta$ is a Bragg angle.)

Moreover, according to the Scherrer's law, there is another relationship defined by following equation (2) between a size D of the crystal lattice and another integrated width $\beta_i$ in the peak of X-ray diffraction lines resulting from the size D.

$$D = \lambda/(\beta_i \cos \theta) \qquad (2)$$

(Here, $\lambda$ is the wavelength of an X-ray for measurement.)

In addition, according to the Hall's law, still another integrated width $\beta$ resulting from both of the crystal-lattice size D and crystal-lattice heterogeneous strain $\eta$ has a still another relationship defined by following Equation (3).

$$\beta = \beta_i + \beta_j \qquad (3)$$

Following relational Equation (4) is derivable eventually from above-mentioned Equations (1) through (3).

$$(\beta \cos \theta)/\lambda = 1/D + 2\eta(\sin \theta)/\lambda \qquad (4)$$

The heterogeneous strain $\eta$ is found from the gradient of a line, which is made obtainable by measuring the integrated width $\beta$ of each of the peaks of the respective diffraction lines, substituting the measured values into Equation (4), and then plotting the values of (β cos θ)/λ against (sin θ)/λ. Note that the β, each of the integrated widths, was computed by an equation, (Integrated Area in Peak of Diffraction Line)/(Peak Height of Diffraction Line). Note that, when finding the c-axis-direction heterogeneous strain $\eta_c$, the heterogeneous strain $\eta_c$ is findable by plotting the values of (β cos θ)/λ of peaks, which result from the (006), (009) and (0012) crystal planes, against (sin θ)/λ.

In the present lithium composite metallic oxide with a lamellar rock-salt crystal structure, a preferable c-axis-direction heterogeneous strain $\eta_c$ is from 0.04 or more to 0.10 or less; and a more preferable c-axis-direction heterogeneous strain $\eta_c$ is from 0.05 or more to 0.10 or less. Moreover, a desirable c-axis-direction heterogeneous strain $\eta_c$ is from 0.055 or more to 0.095 or less. A lithium composite metallic oxide with too small a heterogeneous strain $\eta_c$ means that the crystallinity degree is high. And, when the crystallinity degree of a lithium composite metallic oxide is high, a slight collapse in the crystal structure results in making the diffusion of lithium ions likely to be hindered, and thereby a fear of declining the capacity maintained rate of a lithium-ion secondary battery arises probably. A lithium composite metallic oxide with too large a heterogeneous strain $\eta_c$ probably leads to such a fear that the crystals have collapsed easily.

In the lithium composite metallic oxide with a lamellar rock-salt crystal structure, a preferable all-round-direction heterogeneous strain η is from 0.06 or more to 0.11 or less. A lithium composite metallic oxide with too large an all-round-direction heterogeneous strain η probably leads to such a fear that the crystals have collapsed easily.

Moreover, a suitable relationship between the c-axis-direction heterogeneous strain $\eta_c$ and the all-round-direction heterogeneous strain η is also showable for every transition-metal composition of the present lithium composite metallic oxide.

When a material, to which a treatment according to the present invention is carried out, comprises $LiNi_{1/3}Co_{1/3}Mn_{1/3}O_2$, the present active material exhibits preferably a value of $\eta_c/\eta$ falling within a range of from 0.85 to 1.1; exhibits more preferably a value thereof falling within a range of from 0.86 to 1.05; and exhibits much more preferably a value thereof falling within a range of from 0.90 to 1.0. Moreover, when a material, to which a treatment according to the present invention is carried out, comprises $LiNi_{5/10}Co_{2/10}Mn_{3/10}O_2$, the present active material exhibits preferably a value of $\eta_c/\eta$ being 0.85 or less; exhibits more preferably a value thereof falling within a range of from 0.30 to 0.80; exhibits much more preferably a value thereof falling within a range of from 0.35 to 0.75; and exhibits especially preferably a value thereof falling within a range of from 0.40 to 0.70.

The present active material is not at all restricted especially in the configuration. However, mentioning the configuration in light of an average particle diameter of the secondary agglomerate, a preferable average particle diameter is 100 μm or less; and a more preferable average particle diameter is from 1 μm or more to 50 μm or less. When being less than 1 μm, such a drawback arises probably that the adhesiveness between an active material and a current collector is likely to be impaired, or the like, upon fabricating an electrode using the active material. Exceeding 100 μm probably leads to affecting the size of an electrode, to causing such a drawback that the separator constituting a secondary battery has been damaged, and so on. Note that computing the average particle diameter by measuring the secondary agglomerate instrumentally with a common particle-diameter-distribution meter is also allowed, or observing the secondary agglomerate with a microscope to compute the average particle diameter is even permitted.

Next, a production process for the present active material is hereinafter explained. The present active material is producible by carrying out a specific treatment (i.e., a treatment according to the present invention) to a material belonging to a lamellar rock-salt type, and expressed by the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1).

Following a publicly-known conventional production process using a metallic oxide, a metallic hydroxide or a metallic salt like a metallic carbonate is allowed to produce the material belonging to a lamellar rock-salt type and expressed by the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1), or using such a material as being available commercially is even permitted.

For example, when using lithium carbonate, nickel sulfate, manganese sulfate and cobalt sulfate, the material is producible as follows (i.e., a coprecipitation method). A sulfate-salt aqueous solution including nickel sulfate, cobalt sulfate and manganese sulfate in a predetermined amount, respectively, is alkalified to obtain a coprecipitated slurry, and then the slurry is dried, thereby obtaining a nickel/cobalt/manganese composite hydroxide. The nickel/cobalt/manganese composite hydroxide is dispersed in a sodium hydroxide-containing sodium persulfate aqueous solution, thereby synthesizing a nickel/cobalt/manganese composite oxyhydroxide. A material belonging to a lamellar rock-salt type, and expressed by the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1) is made obtainable by mixing a predetermined amount of lithium carbonate with the nickel/cobalt/manganese composite oxyhydroxide and then calcining the mixture. Giving the obtained material a desirable particle diameter is also allowed by suitably carrying out a pulverization treatment to the material.

Other than the above, the material belonging to a lamellar rock-salt type, and expressed by the general formula: $Li_aNi_bCo_cMn_dD_eO_f$ (where 0.2≤"a"≤1, "b"+"c"+"d"+"e"=1, 0≤"e"<1, "D" is at least one element selected from the group consisting of Li, Fe, Cr, Cu, Zn, Ca, Mg, Zr, S, Si, Na, K and Al, and 1.7≤"f"≤2.1) is made producible by using a known method, such as a molten salt method, a solid phase method, a spray drying method or a hydrothermal method, to a mixed raw material comprising a lithium raw material containing lithium, and a metallic raw material including one or more members selected from the group consisting of Ni, Mn and Co.

The solid phase method is a method for obtaining a lithium composite metallic oxide by mixing or pulverizing a powder of the mixed raw material, drying or powder-compact molding the powder, if needed, and then heating or calcining the powder. A solid phase method having been carried out usually is such that the respective raw materials are mixed one another in proportions in compliance with the composition of a lithium composite metallic oxide to be produced. A preferable temperature for heating the raw-material mixture in the solid phase method is from 900° C.

or more to 1,000° C. or less, and a preferable time for heating the raw-material mixture therein is from eight hours or more to 24 hours or less.

The spray drying method is a method in which a powder of the mixed raw material is dissolved in a liquid to make a solution, the solution is sprayed into the air to make a mist, and then the solution having been turned into the mist is heated. In the spray drying method, further heating the resultant mist is also allowed. A preferable temperature for heating the misted solution in the spray drying method is from 500° C. or more to 1,000° C. or less, and a preferable time for heating the misted solution therein is from three hours or more to eight hours or less.

The hydrothermal method is a method in which the raw materials are mixed with water to make a mixed liquid, and the mixed liquid is heated at a high temperature under a high pressure. A preferable temperature for heating the mixed liquid in the hydrothermal method is from 120° C. or more to 200° C., or less, and a preferable time for heating the mixed liquid therein is from two hours or more to 24 hours or less.

The molten salt method is a method in which a lithium compound is fused to turn into a mol ten salt by heat ing a raw-material mixture including the lithium compound, and then a lithium composite metallic oxide is synthesized within a liquid of the molten salt. In the molten salt method, a lithium raw material not only makes a supply source of Li, but also performs a role of adjusting the oxidizing power of the molten salt. A preferable ratio of Li in the lithium composite metallic oxide to Li in the lithium compound (i.e., (Li in Lithium Composite Metallic Oxide)/(Li in Lithium Compound)) is allowed to be less than one by molar ratio. However, the ratio is preferably from 0.02 or more to less than 0.7, is more preferably from 0.03 to 0.5, and is much more preferably from 0.04 to 0.25, by molar ratio.

Next, a treatment according to the present invention is hereinafter explained. The present treatment is allowed to comprise any of following Treatments 1 through 4.

(Treatment 1) comprising the steps of:
1-1) readying an acidic metallic salt aqueous solution;
1-2) mixing the metallic salt aqueous solution with a material expressed by the aforementioned general formula;
1-3) mixing a liquid obtained at said step 1-2) with an ammonium-phosphate salt aqueous solution; and
1-4) isolating the present active material from another liquid obtained at said step 1-3);

(Treatment 2) comprising the steps of:
2-1) readying an ammonium-phosphate salt aqueous solution;
2-2) mixing the ammonium-phosphate salt aqueous solution with a material expressed by the aforementioned general formula;
2-3) mixing a liquid obtained at said step 2-2) with an acidic metallic salt aqueous solution; and
2-4) isolating the present active material from another liquid obtained at said step 2-3);

(Treatment 3) comprising the steps of:
3-1) readying an aqueous solution of an ammonium-phosphate salt, or an aqueous solution of a metallic salt and an ammonium-phosphate salt;
3-2) mixing the aqueous solution with a material expressed by the aforementioned general formula; and
3-3) isolating the present active material from a liquid obtained at said step 3-2); or (Treatment 4) comprising the steps of:
4-1) readying an acidic metallic salt aqueous solution, and an ammonium-phosphate salt aqueous solution, respectively;
4-2) mixing water with a material expressed by the aforementioned general formula;
4-3) mixing a liquid obtained at said step 4-2), said acidic metallic salt aqueous solution, and said ammonium-phosphate salt aqueous solution one another; and
4-4) isolating the present active material from another liquid obtained at said step 4-3).

The respective treatments are hereinafter described more concretely.

Treatment 1: an acidic metallic salt aqueous solution is readied, and then a material, which belongs to a lamellar rock-salt type and is expressed by the general formula: $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), is added to and stirred in the readied aqueous solution to make a mixed-and-dispersed solution. Subsequently, an ammonium-phosphate salt aqueous solution is further added to and stirred in the above-mentioned mixed-and-dispersed solution being put in a stirred state. The stirring operation is continued for from 15 minutes to one hour approximately. The present active material is isolated by filtering.

Treatment 2: an ammonium-phosphate salt aqueous solution is readied, and then a material, which belongs to a lamellar rock-salt type and is expressed by the general formula: $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn Ca, Mg, Zr, S, Si, Na, K and Al, and $1.7 \leq "f" \leq 2.1$), is added to and stirred in the readied aqueous solution to make a mixed-and-dispersed solution. Subsequently, an acidic metallic-salt aqueous solution is further admixed to and stirred in the above-mentioned mixed-and-dispersed solution being put in a stirred state. The stirring operation is continued for from 15 minutes to one hour approximately. The present active material is isolated by filtering.

Treatment 3: an aqueous solution of an ammonium-phosphate salt, or an aqueous solution of a metallic salt and an ammonium-phosphate salt is readied, and then a material, which belongs to a lamellar rock-salt type and is expressed by the general formula: $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), is added at a time to and stirred in the readied aqueous solution. The stirring operation is continued for from 15 minutes to one hour approximately. The present active material is isolated by filtering.

Treatment 4: an acidic metallic-salt aqueous solution, and an ammonium-phosphate salt aqueous solution are readied, respectively. A material, which belongs to lamellar rock-salt type and is expressed by the general formula: $Li_aNi_bCo_cMn_dD_eO_f$ (where $0.2 \leq "a" \leq 1$, $"b"+"c"+"d"+"e"=1$, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$), is stirred within ion-exchanged water to make a mixed-and-dispersed solution. Subsequently, two kinds of the aforementioned aqueous solutions are added respectively or simultaneously to the aforementioned mixed-and-dispersed solution and stirred therein. The present active material is isolated by filtering.

As for the metallic salt used in any of Treatment through Treatment 4, a metallic nitrate having less influences on batteries even when residing in an active material is preferable. As for the metallic nitrate, the following are exemplifiable: magnesium nitrate, barium nitrate, strontium nitrate, aluminum nitrate, or cobalt nitrate.

As for the ammonium-phosphate salt used in any of Treatment 1 through Treatment 4, the following are exemplifiable: diammonium hydrogen phosphate, ammonium dihydrogen phosphate, or ammonium phosphate. An especially preferable option is diammonium hydrogen phosphate. Moreover, as for a method for preparing the ammonium-phosphate salt aqueous solution, the following are givable: a method of preparing the aqueous solution by dissolving diammonium hydrogen phosphate, ammonium dihydrogen phosphate or ammonium phosphate in water; or a method of preparing the aqueous solution by mixing a phosphoric acid and ammonia with each other, and the like. As for the ammonium-phosphate salt aqueous solution used in any of Treatment 1 through Treatment 4, a weakly-alkaline ammonium-phosphate salt aqueous solution is preferable.

The following aqueous solutions used in any of Treatment 1 through Treatment 4 are not at all limited especially in terms of the concentrations: the metallic salt aqueous solution, and the ammonium-phosphate salt aqueous solution, as well as the aqueous solutions containing a metallic salt and ammonium-phosphate salt. However, a preferable metallic salt aqueous solution has a metallic salt in a concentration falling within a range of from 0.2 to 10% by mass. Moreover, a preferable ammonium-phosphate salt aqueous solution has an ammonium-phosphate salt in a concentration falling within a range of from 0.2 to 50% by mass. In addition, a preferable aqueous solution contains a metallic salt and an ammonium-phosphate salt in a concentration falling within a range of from 0.2 to 10% by mass, respectively.

Setting up a time for the stirring operation suitably is allowed in any of Treatment 1 through Treatment 4.

After any of Treatment 1 through Treatment 4, drying and/or clacining the present active material is also permitted. The drying operation is a step for removing water adhered onto the present active material, is carried out allowably within a range of from 80 to 150° C. for from one to 24 hours or from one to 10 hours approximately, and is carried effectively even under a depressurized condition. The calcining operation is a step for fixing the crystallinity of the present active material, is carried out permissibly within a range of from 400 to 1,200° C., from 500 to 1,100° C. or from 600 to 900° C., for from one to 10 hours or from one to 5 hours approximately. After the calcining step, carrying out a pulverization treatment is also allowed to give a desirable particle diameter to the present active material. Note that the drying step and/or the calcining step do not have any marked influence on the composition ratio in the present active material. However, when the temperature is too low or the time is too short in the calcining step, such a f ear probably arises as the heterogeneous strains become less likely to occur; whereas, when the temperature is too high therein, such another fear probably arises as atomic rearrangements take place so that the heterogeneous strains have disappeared.

The generation of the high manganese portion is ascertainable by measuring the surface of an active material after the treatment according to the present invention by an X-ray photoelectronic spectroscopy and then carrying out a composition analysis. A thickness of the superficial layer including the high manganese portion is ascertainable by observing a cut face made by cutting the present active material with a transmission electron microscope, or by measuring the cut face with a TEM-EDX, a combination of a transmission electron microscope and a dispersion X-ray analyzing device, and then doing a compositional analysis, for instance. Moreover, another composition ratio in any port ion other than the superficial layer in the present active material is ascertainable by measuring another cut face made by cutting the present active material with a TEM-EDX, a combination of a transmission electron microscope and a dispersion X-ray analyzing device, for instance.

Note that, in consideration of the aforementioned specific treatment, the present active material is apparently modified to being Mn rich in the composition ratio in the active-material superficial layer, although no Mn is added thereto by the specific treatment. Hence, a technology according to the present invention is a totally different technology from such a technology as Mn or an Mn-containing compound is added to an active material to adhere the Mn or Mn-containing compound on or in the vicinity of the active-material surface. Moreover, as being apparent from separating an active material from the ammonium phosphate salt aqueous solution by the aforementioned specific treatment, and from the fact that no phosphorous was detected from active materials according to examples described below, the present active materials and production processes are quite distinct from an active material coated with a phosphorous-containing layer disclosed in Japanese Unexamined Patent Publication (KOKAI) Gazette No. 2003-7299, for instance, and a product ion process for the same disclosed therein.

Although an Mn composition ratio in the superficial layer of the present active material becomes high by carrying out the aforementioned specific treatment, a Co composition therein becomes low contrarily. An Ni composition ratio also become high in an occasion, or even becomes low in another occasion. And, in consideration of the Mn composition ratio modified to be high in the superficial layer of the present active material and the Co composition ratio modified to be low therein regardless of the fact that no Mn is added to the present active material by the specific treatment, Co in the superficial layer of a material expressed by the general formula: $Li_aNi_bCo_cMn_dD_eO_f$ (where $0.2 \leq \text{``a''} \leq 1$, "b"+"c"+"d"+"e" 1, $0 \leq \text{``e''} < 1$, "D" is at least one element selected from the group consisting of Li, Fe, Cr, Cu, Zn, Ca, Mg, Zr, S, Si, Na, K and Al, and $1.7 \leq \text{``f''} \leq 2.1$) is assumably eluted into the aqueous solutions (and Ni there in is also eluted thereinto depending on cases) by the aforementioned specific treatment. As a consequence, changes are assumably enabled to arise in the superficial-layer composition ratios. The likeliness of eluting into the aqueous solutions seems to be ordered as follows Co, Ni, and Mn.

If so, the high manganese portion is also expressible by a general formula: $Li_{a3}Ni_{b3}Co_{c3}Mn_{d3}D_{e3}O_{f3}$ (where $0.2 \leq \text{``a3''} \leq 1$, "b3"+"c3"+"d3"+"e3"<1, 0<"b3" "b", 0<"c3"<"c", 0<"d3"≤"d", 0≤"e3"<1, "D" is at least one element selected from the group consisting of Li, Fe, Cr, Cu, Zn, Ca, Mg, Zr, S, Si, Na, K and Al, and $1.7 \leq \text{``f3''} \leq 2.1$).

Moreover, examining the concrete contents of the aforementioned specific treatment along with the difference between the patterns of integrated strengths in an image of the first through third superlattice-structure portions according to the present invent ion observed with a high-angle scattering annular dark-field scanning transmission electron microscope and the other patterns of integrated strengths in another image of the conventional ordinary superlattice plane obtained therewith, believing as follows is possible in the aforementioned specific treatment: some of the metals in the $[\sqrt{3} \times \sqrt{3}]R30°$ type ordinary superlattice plane at the 3b sites in the lamellar rock-salt structure have been removed distinctively. For example, when believing that only Co of the Ni, Co and Mn at the 3b sites in the lamellar rock-salt structured $LiNi_{1/3}Co_{1/3}Mn_{1/3}O_2$ has been removed, the integrated strengths of the regular first through third superlattice-structure portions according to the present invention are explainable. Understanding becomes easy probably when supposing an ordinary superlattice plane from which only Co has been removed distinctively in the schematic diagram shown in FIG. 1. That is, the specific treatment is presumed to have removed a specific metal distinctively from the superficial layer of a material belonging to a lamellar rock-salt type, and expressed by the general formula: $Li_a$-$Ni_bCo_cMn_dD_eO_f$ (where $0.2\leq"a"\leq1$, "b"+"c"+"d"+"e"=1, $0\leq"e"<1$, at least one element selected from the group consisting of Li, Fe, Cr, Cu, Zn, Ca, Mg, Zr, S, Si, Na, K and Al, and $1.7\leq"f"\leq2.1$). The removal of the specific metal is presumed to result in strains occurred in the crystals of the aforementioned material. Believing as hereinafter described is also possible: at the calcining step to be carried out subsequently, interactions between high-temperature states and stresses arising from the strains in the crystals to act on the superficial layer lead to generating the first through third superlattice-structure portions with stable crystal structures.

Constituting the 3b sites of a $[\sqrt{3}\times\sqrt{3}]R30°$ type in a lamellar rock-salt structure according to the aforementioned general formula is advantageous.

Hereinafter, relationships between a $[\sqrt{3}\times\sqrt{3}]R30°$ type at the 3b sites in a lamellar rock-salt structure according to the general formula, and metallic defects at the 3b sites resulting from the aforementioned specific treatment, as well as the first through third superlattice-structure portions according to the present invention are discussed. In order to make understanding easy, an instance where the 3b sites are constituted of three elements, Ni, Co and Mn, is supposed.

When the 3b sites in a lamellar rock-salt structure are constituted of $Ni_{1/3}Co_{1/3}Mn_{1/3}$, the ordinary superlattice plane is expressible as a $[\sqrt{3}\times\sqrt{3}]R30°$ type, as set forth in the above-described literature. When paying attention herein to the valences of which Ni, Co and Mn have, the metals have stable valences, such as $Ni^{2+}$, $Co^{3+}$ and $Mn^{4+}$, respectively, to exist in the 3b sites. And, the respective metals adopt a regular $[\sqrt{3}\times\sqrt{3}]R30°$ type in compliance with the valences in order to avoid localizing the positive charges.

Next, another instance where the 3b sites in a lamellar rock-salt structure are constituted of $Ni_{5/10}Co_{2/10}Mn_{3/10}$ is examined. Since an average of the valences at the 3b sites is needed to be "$3^+$", Ni, Co and Mn are not enabled to exist alone as $Ni^{2+}$, $Co^{3+}$ and $Mn^{4+}$ with the stable valences. Since $Ni_{5/10}Co_{2/10}Mn_{3/10}$ is rich in Ni and poor in Co, compared with $Ni_{1/3}Co_{1/3}Mn_{1/3}$, some of Ni comes to exist as $Ni^{3+}$, instead of deficient $Co^{3+}$. Understanding becomes easy probably when supposing an ordinary superlattice plane in which Ni has substituted for some of Co in the schematic diagram shown in FIG. 1. Hence, even when the 3b sites in a lamellar rock-salt structure are constituted of $Ni_{5/10}Co_{2/10}Mn_{3/10}$, adopting a regular $[\sqrt{3}\times\sqrt{3}]R30°$ type in compliance with the valences in order to avoid the localizing the positive charges is said to be advantageous for the respective metals.

Likewise, when the 3b sites in a lamellar rock-salt structure has been poor in Ni but becomes rich in Co, compared with $Ni_{1/3}Co_{1/3}Mn_{1/3}$, for instance, some of Co comes to exist as $Co^{2+}$, instead of deficient $Ni^{2+}$. Moreover, when the 3b sites in another lamellar rock-salt structure has been poor in Ni but becomes rich in Mn, compared with $Ni_{1/3}Co_{1/3}Mn_{1/3}$, for instance, some of Mn comes to exist as $Mn^{2+}$, instead of deficient $Ni^{2+}$. Therefore, even when the composition of the 3b sites in the lamellar rock-salt structure, which are constituted of three elements, Ni, Co and Mn, is a composition being different from $Ni_{1/3}Co_{1/3}Mn_{1/3}$, adopting a regular $[\sqrt{3}\times\sqrt{3}]R30°$ type in compliance with the valences in order to avoid localizing the positive charges is believed to be advantageous for the respective metals at the 3b sites.

And, since the aforementioned specific treatment removes a specific metal in the 3b sites selectively, regular metallic defects occur at the 3b sites. The first through third superlattice-structure portions according to the present invention are expressions for regular metallic defects from out of the 3b sites in an ordinary superlattice plane. Note that, of the three elements (i.e., Ni, Co and Mn), Co is most likely to be removed and Mn is least likely to be removed in the aforementioned specific treatment.

In accordance with the above examinations, the superficial layer of a material belonging to a lamellar rock-salt type and expressed by the general formula: $Li_aNi_bCo_cMn_dD_eO_f$ (where $0.2\leq"a"\leq1.2$, "b"+"c"+"d"+"e"=1, $0\leq"e"<1$, "D" is at least one element selected from the group consisting of Li, Fe, Cr, Cu, Zn, Ca, Mg, Zr, S, Si, Na, K and Al, and $1.7\leq"f"\leq2.1$) to which the aforementioned specific treatment has been carried out is able to generate the first through third superlattice-structure portions according to the present invention not only in the instance where the 3b sites are constituted of $Ni_{1/3}Co_{1/3}Mn_{1/3}$ with "b"=1/3, "c"=1/3, "d"=1/3 and "e"=0 but also in the other instances.

In accordance with the above mechanism, a preferable surface of a prior-to-specific-treatment material comprises a $[\sqrt{3}\times\sqrt{3}]R30°$ type ordinary superlattice plane. However, even when the surface of a prior-to-specific-treatment material does not comprise any ordinary superlattice plane, strains in the crystals of the material resulting from the aforementioned specific treatment, and stresses concentrating at around the superficial layer of the material, as well as exposing the material to high-temperature conditions lead to making rearrangements of metallic elements occur in the surface of the material. As a consequent, the following is assumable: the first through third superlattice-structure portions with stable crystal structures are enabled to arise. Moreover, the occurrence of the following instance is also assumable: a $[\sqrt{3}\times\sqrt{3}]R30°$ type ordinary superlattice plane is enabled to arise in the vicinity of the thus arisen first through third superlattice-structure portions.

The first through third superlattice-structure portions exist in the superficial layer of the present invention active material. Even if the mechanism as aforementioned, namely, removing a specific metal, results in generating the first through third superlattice-structure portions, the superficial layer accounts for a slightly less volume to the entire volume of the present active material. Therefore, composition changes occurred in the first through third superlattice-structure portions do not have any influence virtually on the compositions expressed by the general formula: $Li_aNi_bCo_cMn_dD_eO_f$ (where $0.2\leq"a"\leq1.2$, "b"+"c"+"d"+"e"=1, $0\leq"e"<1$, "D" is at least one element selected from the group consisting of Li, Fe, Cr, Cu, Zn, Ca, Mg, Zr, S, Si, Na, K and Al, and $1.7\leq"f"\leq2.1$).

Moreover, the elemental compositions of the high manganese portion and first through third superlattice-structure portions were revealed that the composition ratios of Mn and oxygen become high. Incidentally, such a material as $Li_2MnO_3$ exhibiting a high capacity but being inactive, and an $Li_2MnO_3$—$LiMO_2$ solid solution incorporating the material therein (where "M" is a transition metal) have been known recently (for example, see FB Technical News, No. 66, 2011.1, pp. 3-10, Making Lithium-ion Battery Be of High Performance: On Solid-solution Positive-electrode Material by SATO Yuichi). In consideration of the elemental compositions of the aforementioned high manganese portion and first through third superlattice-structure portions, there is such a possibility that the high manganese portion and first through third superlattice-structure portions partially comprise crystal structures arising in the aforementioned $Li_2MnO_3$ or $Li_2MnO_3$—$LiMO_2$ solid solution, or crystal structures similar to such structures.

Using the present active material makes a lithium-ion secondary battery manufacturable. In addition to an electrode (a positive electrode, for instance) including the present active material, the aforementioned lithium-ion secondary battery further comprises a negative electrode, a separator and an electrolytic solution, as battery constituent elements.

The positive electrode is constituted of a current collector, and an active-material layer including the present active material. Note that, in the active-material layer, further including an active material other than the present active material is also allowed.

A "current collector" refers to a chemically inactive high electron conductor for keeping an electric current flowing to electrodes during the discharging or charging operations of a lithium-ion secondary battery. As for the current collector, the following are exemplifiable: at least one member selected from the group consisting of silver, copper, gold, aluminum, magnesium, tungsten, cobalt, zinc, nickel, iron, platinum, tin, indium, titanium, ruthenium, tantalum, chromium, and molybdenum; as well as metallic materials, such as stainless steels. Covering the current collector with a publicly-known protective layer is also allowed.

The current collector is enabled to have such a form as a foil, a sheet, a film, a linear shape, or a rod-like shape. Consequently, as the current collector, a metallic foil, such as a copper foil, a nickel foil, an aluminum foil or a stainless-steel foil, is usable suitably. When the current collector has a foiled, sheeted or filmed form, a preferable thickness thereof falls within a range of from 10 μm to 100 μm.

Making the positive electrode is made possible by forming the active-material layer onto a surface of the current collector.

The active-material layer is permitted to further include a conductive additive. The conductive additive is added in order to enhance the electrically-conducting property of an electrode. As for the conductive additive, the following are exemplified: carbonaceous fine particles, such as carbon black, graphite, acetylene black (or AB) and KETJEN-BLACK (or KB (registered trademark)); and gas-phase-method carbon fibers (or vapor-grown carbon fibers (or VGCF)). One of the conductive additives is addable independently, or two or more thereof are combinable to add to the active-material layer. Although an employment amount of the conductive additive is not at all restricted especially, setting the employment amount is possible, for instance, at from one to 50 parts by mass, or at from one to 30 parts by mass, with respect to the present active material in an amount of 100 parts by mass.

The active-material layer is permitted to further include a binding agent. The binding agent performs a role of fastening the present active material and a conductive additive together onto the surface of a current collector. As for the binding agent, the following are exemplifiable: fluorine-containing resins, such as polyvinylidene fluoride, polytetrafluoroethylene and fluorinated rubber; thermoplastic resins, such as polypropylene and polyethylene; imide-based resins, such as polyimide and polyamide-imide; and alkoxysilyl group-containing resins. Although an employment amount of the binding agent is not at all restricted especially, setting the employment amount is possible at from five to 50 parts by mass with respect to the present active material in an amount of 100 parts by mass, for instance.

As for a method of forming an active-material layer onto the surface of a current collector, the present active material is permitted to be coated onto a surface of the current collector using a heretofore publicly-known method, such as a roll-coating method, a dip-coating method, a doctor-blade method, a spray-coating method or a curtain-coating method. To be concrete, a composition for forming an active-material layer including the present active material, as well as a binding agent and conductive additive, if needed, is prepared. After adding a proper solvent to the composition to turn the composition into a paste-like composition, the composition is coated onto a surface of the current collector, and is thereafter dried thereon. If needed, the post-drying composition is also allowed to be compressed in order to enhance the density of an electrode.

As for the solvent, N-methyl-2-pyrrolidone (or NMP), methanol, and methyl isobutyl ketone (or MIRK) are exemplifiable.

The negative electrode comprises a current collector, and a negative-electrode active-material layer bound together onto a surface of the current collector.

The negative-electrode active-material layer includes a negative-electrode active material, as well as a binding agent and/or a conductive additive, if needed.

The current collector, binding agent and conductive additive are the same as the current collector, binding agent and conductive additive explained in the positive electrode.

As for the negative-electrode active material, the following are exemplifiable: carbon-based materials being capable of occluding and releasing (or sorbing and desorbing) lithium; elements being capable of alloying with lithium; compounds comprising an element being capable of alloying with lithium; or polymeric materials.

As for the carbon-based material, the following are exemplifiable: non-graphitizable carbon, artificial graphite, cokes, graphites, glassy carbons, organic-polymer-compound calcined bodies, carbon fibers, activated carbon, or carbon blacks. Note herein that the "organic-polymer-compound calcined bodies" refer to calcined bodies carbonized by calcining polymeric materials, such as phenols and furans, at a proper temperature.

As for the element being capable of alloying with lithium, the following are exemplifiable concretely: Na, K, Rb, Cs, Fr, Be, Mg, Ca, Sr, Ba, Ra, Ti, Ag, Zn, Cd, Al, Ga, In, Si, Ge, Sn, Pb, Sb, and Bi. In particular, Si, or Sn is preferred.

As for the compound comprising an element being capable of alloying with lithium, the following are exemplifiable concretely: ZnLiAl, AlSb, $SiB_4$, $SiB_6$, $Mg_2Si$, $Mg_2Sn$, $Ni_2Si$, $TiSi_2$, $MoSi_2$, $CoSi_2$, $NiSi_2$, $CaSi_2$, $CrSi_2$, $Cu_5Si$, $FeSi_2$, $MnSi_2$, $NbSi_2$, $TaSi_2$, $VSi_2$, $WSi_2$, $ZnSi_2$, SiC, $Si_3N_4$, $Si_2N_2O$, $SiO_v$ (where $0<"v"\leq2$), $SnO_w$ (where $0<"w"\leq2$), $SnSiO_3$, LiSiO, or LiSnO. In particular, $SiO_x$ (where $0.3\leq"x"\leq1.6$, or $0.5\leq"x"\leq1.5$) is preferred.

Among the options, an allowable negative-electrode active material comprises an Si-based material including Si. A permissible Si-based material comprises silicon or/and a silicon compound being capable of sorbing and desorbing lithium ions. For example, an allowable Si-based material comprises $SiO_x$ (where $0.5\leq"x"\leq1.5$). Although silicon has large theoretical charged and discharged capacities, silicon exhibits large volumetric changes at the time of charging and discharging operations. Hence, making a negative-electrode active material of $SiO_x$ including silicon enables the volumetric changes of silicon to be relieved.

Moreover, a preferable Si-based material has an Si phase, and an $SiO_2$ phase. The Si phase comprises a silicon elementary substance, is a phase being able to sorb and desorb Li ions, and expands and contracts as accompanied by sorbing and desorbing Li ions. The $SiO_2$ phase comprises $SiO_2$, and makes a buffer phase absorbing the expansions and contractions of the Si phase. A more preferable Si-based material comprises the Si phase covered by the $SiO_2$ phase. In addition, an allowable Si-based material comprises a plurality of the pulverized Si phases integrated to form particles by being covered with the $SiO_2$ phase. In the instance, the volumetric changes of the entire Si-based material are suppressible effectively.

A preferable mass ratio of the $SiO_2$ phase to the Si phase in the Si-based material is from one to three. When said mass ratio is less than one, the expansions and contractions of the Si-based material become large, and so such a fear probably arises that cracks occur in the negative-electrode active-material layer including the Si-based material. On the other hand, when said mass ratio exceeds three, the Li-ion sorbing and desorbing amounts of the negative-electrode active material become less, and thereby the electric capacitance of a battery per the negative-electrode unit mass becomes low.

Moreover, as the compound comprising an element capable of undergoing an alloying reaction with lithium, tin compounds, such as tin alloys (e.g., Cu—Sn alloys, Co—Sn alloys, and the like), are exemplifiable.

As for the polymeric material, polyacetylene, and polypyrrole are exemplifiable concretely.

The separator is one of the constituent elements making lithium ions pass therethrough while isolating the positive electrode and negative electrode from one another and preventing the two electrodes from contacting with each other to result in electric-current short-circuiting. As for the separator, the following are exemplifiable, for instance: porous membranes using one member or a plurality of synthetic resins, such as polytetrafluoroethylene, polypropylene or polyethylene; or porous membranes made of ceramics.

The electrolytic solution includes a nonaqueous solvent, and an electrolyte dissolved in the nonaqueous solvent.

As for the nonaqueous solvent, cyclic esters, linear or chain-shaped esters, ethers, and the like, are employable. As for the cyclic esters, the following are exemplifiable: ethylene carbonate, propylene carbonate, butylene carbonate, gamma-butyrolactone, vinylene carbonate, 2-methyl-gamma-butyrolactone, acetyl-gamma-butyrolactone, and gamma-valerolactone. As for the linear esters, the following are exemplifiable: dimethyl carbonate, diethyl carbonate, dibutyl carbonate, dipropyl carbonate, methyl ethyl carbonate, alkyl propionate ester, dialkyl malonate ester, alkyl acetate ester, and so forth. As for the ethers, the following are exemplifiable: tetrahydrofuran, 2-methyltetrahydrofuran, 1,4-dioxane, 1,2-dimethoxyethane, 1,2-diethoxyethane, and 1,2-dibutoxyethane.

As for the electrolyte, a lithium salt, such as $LiClO_4$, $LiAsF_6$, $LiPF_6$, $LiBF_4$, $LiCF_3SO_3$ or $LiN(CF_3SO_2)_2$ is exemplifiable.

As for the electrolytic solution, the following solution is exemplifiable: a solution comprising a lithium salt, such as $LiClO_4$, $LiPF_6$, $LiBF_4$ or $LiCF_3SO_3$, dissolved in a concentration of from 0.5 mol/L to 1.7 mol/L approximately in a nonaqueous solvent, such as ethylene carbonate, dimethyl carbonate, propylene carbonate or diethyl carbonate.

A lithium-ion secondary battery using the present active material is less likely to degrade, and exhibits a suitable capacity maintained rate, because the lithium-ion secondary battery comprises: the stable high manganese portion in the active-material superficial layer; or the stable first through third superlattice-structure portions in the active-material superficial layer; or a parameter of the heterogeneous strains in a lamellar rock-salt crystal structure within a suitable range. As a consequence, the lithium-ion secondary battery using the present active material is able to exhibit a satisfactory capacity maintained rate even under a high-potential driving or operating condition. Consequently, the lithium-ion secondary battery using the present active material is a battery maintaining large charged and discharged capacities and having excellent cyclic performance. Note herein that the "high-potential driving or operating condition" refers to conditions where a lithium-ion operating potential to lithium metal is 4.3 V or more, and is further from 4.4 V to 4.6 V or from 4.5 V to 5.5 V. In the lithium-ion secondary battery using the present active material, setting a charging potential of the positive electrode is possible at 4.3 V or more, and further at from 4.4 V to 4.6 V or from 4.5 V to 5.5 V, to lithium metal serving as the standard. Note that, in the driving or operating condition of a common lithium-ion secondary battery, a lithium-ion operating potential to lithium metal is less than 4.3 V.

Since a type of the lithium-ion secondary battery using the present active material is not at all limited especially, various types, such as cylindrical types, rectangular types, coin types and laminated types, are adoptable.

The lithium-ion secondary battery using the present active material is mountable in a vehicle. Since the lithium-ion secondary battery using the present active material maintains large charged and discharged capacities and has excellent cyclic performance, the vehicle having the battery on-board makes a high-performance vehicle.

As for the vehicle, an allowable vehicle is a vehicle making use of electric energies produced by battery for all or some of the power source. For example, the following are given: electric automobiles, hybrid automobiles, plug-in hybrid automobiles, hybrid railroad vehicles, electric-powered forklifts, electric wheelchairs, electric-power-assisted bicycles, and electric-powered two-wheel vehicles.

Having been described so far are the embodiment modes of the present active material for lithium-ion secondary battery. However, the present invention is not limited to the aforementioned embodying modes at all. The present invention is feasible in various modes, to which changes or modifications that one of ordinary skill in the art carries out are made, within a range not departing from the gist of the present invention.

EXAMPLE

Hereinafter, examples and comparative examples are shown, and thereby the present invention is described more concretely. Note that the examples in the following descriptions do not limit the present invention at all. In the following descriptions, the term, "part," means a part by mass, and the term, "%," means a percentage by mass, unless otherwise specified especially.

First Example

Aforementioned Treatment 1 was followed, thereby carrying out the following treatments to a lithium composite metallic oxide serving as a starting substance.

A lithium composite metallic oxide made by a coprecipitation method and expressed by $LiNi_{1/3}Co_{1/3}Mn_{1/3}O_2$ was readied. Surface-modifying aqueous solutions including $(NH_4)_2HPO_4$ in an amount of 4.0% by mass and $Mg(NO_3)_2$ in an amount of 5.8% by mass when each of the aqueous solutions was taken entirely as 100% by mass were prepared, respectively. The lithium composite metallic oxide was immersed into the surface-modifying aqueous solutions, and was then stirred in the aqueous solutions and mixed therewith at room temperature. The immersion time was set at one hour.

A filtration was carried out after the immersion. Subsequently, the surface-modified lithium composite metallic oxide was dried at 130° C. for six hours. Thereafter, the obtained lithium composite metallic oxide was heated at 700° C. under an air atmosphere for five hours. A product obtained by the treatments was labeled an active material according to a first example.

A lithium-ion secondary battery according to the first example was fabricated in the following manner.

A positive electrode was made as described below.

An aluminum foil with a thickness of 20 μm was readied to serve as a current collector for positive electrode. The following were mixed one another: the active material according to the first example in an amount of 94 parts by mass; acetylene black (or AB) serving as a conductive additive in an amount of three parts by mass; and polyvinylidene fluoride (or PVdF) serving as a binder in an amount of three parts by mass. The mixture was dispersed in a proper amount of N-methyl-2-pyrrolidone (or NMP), thereby preparing a slurry. The aforementioned slurry was put on a surface of the aforementioned aluminum foil, and then the slurry was coated thereon so as to be in the shape of a film using a doctor blade. The NMP was removed by means of volatilization by drying the aluminum foil with the slurry coated at 80° C. for 20 minutes, thereby forming an active-material layer on the aluminum-foil surface. The aluminum foil with the active-material layer formed on the surface was compressed using a roll pressing machine, thereby adhesion joining the aluminum foil and the active-material layer firmly with each other. The joined substance was heated at 120° C. for six hours with a vacuum drier, and was then cut out to a predetermined configuration (e.g., a rectangular shape with 25 mm×30 mm), thereby obtaining a positive electrode.

A negative electrode was made as described below.

The following were mixed one another: graphite in an amount of 97 parts by mass; KB serving as a conductive additive in an amount of one part by mass; and styrene-butadiene rubber (or SBR) as well as carboxymethyl cellulose (or CMC) in an amount of one part by mass, respectively, the two serving as a binding agent. The mixture was dispersed in a proper amount of ion-exchanged water to prepare a slurry. The slurry was coated onto a copper foil with a thickness of 20 μm (i.e., a current collector for negative electrode) so as to be in the shape of a film using a doctor blade. The copper foil with the slurry coated thereon was dried, and was thereafter pressed. The joined substance was heated at 120° C. for six hours with a vacuum drier, and was then cut out to a predetermined configuration (e.g., a rectangular shape with 25 mm×30 mm), thereby making a negative electrode with a thickness of 85 μm approximately.

Using the above-mentioned positive electrode and negative electrode, a laminated-type lithium-ion secondary battery was manufactured. To be concrete, a rectangle-shaped sheet serving as a separator and comprising a polypropylene/polyethylene/polypropylene three-layered-construction resinous film with 27×32 mm in size and 25 μm in thickness was interposed or held between the positive electrode and the negative electrode, thereby making a polar-plate subassembly. After covering the polar-plate subassembly with laminated films in which two pieces made a pair and then sealing the laminated films at the three sides, an electrolytic solution was injected into the laminated films which had been turned into a bag shape. As for the electrolytic solution, a solution was used: the solution comprised a solvent in which ethylene carbonate (or EC), and diethyl carbonate (or DEC) had been mixed one another in such a ratio as EC:DEC=3:7 by volume; and $LiPF_6$ dissolved in the solvent so as to make 1 mol/L. Thereafter, the remaining one side was sealed, thereby obtaining a laminated-type lithium-ion secondary battery in which the four sides were sealed air-tightly and in which the polar-plate subassembly and electrolytic solution were closed hermetically. Note that the positive electrode and negative electrode were equipped with a tab connectable electrically with the outside, respectively, and the tabs extended out partially to the outside of the laminated-type lithium-ion secondary battery.

Via the above steps, the laminated-type lithium-ion secondary battery according to the first example was fabricated.

Second Example

Other than varying the time to 36 hours during which the lithium composite metallic oxide was immersed into the surface-modifying aqueous solutions, an active material and laminated-type lithium-ion secondary battery according to a second example were fabricated by the same methods as described in the first example.

Third Example

Other than varying the respective surface-modifying aqueous solutions to an aqueous solution including $(NH_4)_2HPO_4$ in an amount of 2.1% by mass when the entire aqueous solution was taken as 100% by mass and an aqueous solution including $Mg(NO_3)_2$ in an amount of 3.0% by mass when the entire aqueous solution was taken as 100% by mass, respectively, an active material and laminated-type lithium-ion secondary battery according to a third example were fabricated by the same methods as described in the first example.

Fourth Example

Other than varying the surface-modifying aqueous solutions to an aqueous solution including $(NH_4)_2HPO_4$ in an amount of 5.4% by mass when the entire aqueous solution was taken as 100% by mass, an active material and laminated-type lithium-ion secondary battery according to a fourth example were fabricated by the same methods as described in the first example.

First Comparative Example

Other than using as an active material $LiNi_{1/3}Co_{1/3}Mn_{1/3}O_2$ per se (hereinafter, being sometimes referred to "an untreated product according to a first comparative example"), a laminated-type lithium-ion secondary battery according to a first comparative example was fabricated by the same method as described in the first example.

First Evaluating Example

Initial capacities of the lithium-ion secondary batteries according to the first through fourth examples and the first comparative examples were measured. A discharged capacity was measured when carrying out a CC discharging (i.e., constant-current discharging) mode or operation to each of the batteries to be measured at a rate of 0.33 C with a voltage of 3.0 V after carrying out a CCCV charging (i.e., constant-current and constant-voltage charging) mode or operation to each of the batteries at 25° C. at a rate of 0.33 C with a voltage of 4.5 V. The thus measured discharged capacities were labeled the initial capacities.

In addition, each of the batteries to be measured underwent a 4.5-V charging/3.0-V discharging cycle for 25 cycles in which a CCCV charging (i.e., constant-current and constant-voltage charging) mode or operation was carried out to each of the batteries at 55° C. at a rate of 1 C with a voltage of 4.5 V, retaining or leaving each of the batteries alone for 2.5 hours, and thereafter carrying out a CC discharging (i.e., constant-current discharging) mode or operation to each of the batteries at a rate of 0.33 C with a voltage of 3.0 V. Thereafter, discharged capacities at a rate of 0.33 C were measured, and then capacity maintained rates were computed.

The capacity maintained rates (%) were found by the following equation.

Capacity Maintained Rate (%)={(Post-cycle Capacity)/(Initial Capacity)}×100

Note that 1 C refers to a current rate at which a battery is discharged for one hour, for instance.

Table 1 shows results of measuring the Ni, Co and Mn composition ratios in the superficial layer of the active materials, the initial capacities, the post-25-cycle capacities, and the capacity maintained rates.

TABLE 1

| | Superficial-layer Composition Ratio | | | Initial | Post-cycle | Capacity |
|---|---|---|---|---|---|---|
| | Ni (b2) | Co (c2) | Mn (d2) | Capacity (mA · h/g) | Capacity (mA · h/g) | Maintained Rate (%) |
| 1st Ex. | 0.32 | 0.21 | 0.47 | 172.7 | 135.6 | 78.5 |
| 2nd Ex. | 0.28 | 0.10 | 0.62 | 157.5 | 125.0 | 79.4 |
| 3rd Ex. | 0.45 | 0.17 | 0.38 | 160.2 | 116.3 | 72.6 |
| 4th Ex. | 0.31 | 0.25 | 0.44 | 165.8 | 100.5 | 60.6 |
| 1st Comp. Ex. | 0.33 | 0.33 | 0.33 | 177.3 | 85.7 | 48.3 |

The Ni, Co and Mn composition ratios in the superficial layer of the active materials were computed by means of measuring the surface of the active materials by an X-ray photoelectric spectroscopy. The fact that the internal composition ratios of the active materials were not changed was ascertained by analyzing the internal compositions from a particle cross-sectional direction with a TEM-EDX. Moreover, on the occasion, the detected signals of Mg and P used in the treatment step were the detection limits or less of the TEM-EDX analysis at the superficial layer and interior. That is, in the superficial layer of an active material be ing obtainable at the specific treatment step, an element added from the outside is not said to develop the new performance, but a modified surface done by elements included therein from the very beginning is said to enable the functional improvements to be demonstrated.

When comparing the respective examples with the comparative example on the Ni, Co and Mn composition ratios in the superficial layer of the active materials, the Mn composition was found out to become high even in any of the examples, whereas the Co composition was found out to become low therein on the contrary.

When comparing the first through fourth examples with the first comparative example on the capacity maintained rates, the capacity maintained rates were found out to be upgraded markedly even in any of the examples than in the first comparative example.

From the results above, making the Mn composition ratio in the superficial layer of an active material higher than the Mn composition ratio of the original (or in the internal) active material is said to result in turning the active material into an active material exhibiting a favorable capacity maintained rate.

Fifth Example

A lithium composite metallic oxide made by a coprecipitation method and expressed by $LiNi_{5/10}Co_{2/10}Mn_{3/10}O_2$ was readied. Except that the respective surface-modifying aqueous solutions were hereinafter varied to an aqueous solution including $(NH_4)_2HPO_4$ in an amount of 0.4% by mass when the entire aqueous solution was taken as 100% by mass and an aqueous solution including $Mg(NO_3)_2$ in an amount of 1.4% by mass when the entire aqueous solution was taken as 100% by mass, respectively, an active material according to a fifth example was obtained using the same method as described in the first example.

Using the active material obtained as above, a laminated-type lithium-ion secondary battery according to the fifth example was fabricated by the following method.

Other than using the active material according to the fifth example as an active material, a positive electrode was made in the same manner as the aforementioned first example.

A negative electrode was made as described below.

The following were mixed one another: carbon-coated $SiO_x$ (where $0.3 \leq "x" \leq 1.6$) in an amount of 32 parts by mass; graphite in an amount of 50 parts by mass; acetylene black serving as a conductive additive in an amount of eight parts by mass; and polyamide-imide serving as a binding agent in an amount of 10 parts by mass. The mixture was dispersed in a proper amount of ion-exchanged water to prepare a slurry. The slurry was coated onto a copper foil with a thickness of 20 μm (i.e., a current collector for negative electrode) so as to be in the shape of a film using a doctor blade. The current collector with the slurry coated thereon was dried, and was thereafter pressed. The joined substance was heated at 120° C. for six hours with a vacuum drier, and was then cut out to a predetermined configuration (e.g., a rectangular shape with 25 mm×30 mm), thereby making a negative electrode with a thickness of 85 μm approximately.

Using the above-mentioned positive electrode and negative electrode, a laminated-type lithium-ion secondary battery was manufactured. To be concrete, a rectangle-shaped sheet serving as a separator and comprising a polypropylene/polyethylene/polypropylene three-layered-construction resinous film with 27×32 mm in size and 25 μm in thickness was interposed or held between the positive electrode and the negative electrode, thereby making a polar-plate subassembly. After covering the polar-plate subassembly with laminated films in which two pieces made a pair and then sealing the laminated films at the three sides, an electrolytic solution was injected into the laminated films which had been turned into a bag shape. As for the electrolytic solution, a solution was used: the solution comprised a solvent in which ethylene carbonate, methyl ethyl carbonate and diethyl carbonate had been mixed one another in such a ratio as 3:3:4 by volume; and $LiPF_6$ dissolved in the solvent so as to make 1 mol/L. Thereafter, the remaining one side was sealed, thereby obtaining a laminated-type lithium-ion secondary battery according to the fifth example in which the four sides were sealed air-tightly and in which the polar-plate subassembly and electrolytic solution were closed hermetically. Note that the positive electrode and negative electrode were equipped with a tab connectable electrically with the outside, respectively, and the tabs extended out partially to the outside of the laminated-type lithium-ion secondary battery.

Sixth Example

Except that the respective surface-modifying aqueous solutions were varied to an aqueous solution including $(NH_4)_2HPO_4$ in an amount of 4.0% by mass when the entire aqueous solution was taken as 100% by mass and an aqueous solution including $Mg(NO_3)_2$ in an amount of 14.0% by mass when the entire aqueous solution was taken as 100% by mass, respectively, an active material according to a sixth example was obtained us ing the same method as described in the fifth example.

Using the active material obtained as above, a laminated-type lithium-ion secondary battery according to the sixth example was fabricated by the same method as described in the fifth example.

Seventh Example

Except that the respective surface-modifying aqueous solutions were varied to an aqueous solution including $(NH_4)_2HPO_4$ in an amount of 0.4% by mass when the entire aqueous solution was taken as 100% by mass and an aqueous solution including $Ba(NO_3)_2$ in an amount of 1.4% by mass when the entire aqueous solution was taken as 100% by mass, respectively, an active material according to a seventh example was obtained using the same method as described in the fifth example.

Using the active material obtained as above, a laminated-type lithium-ion secondary battery according to the seventh example was fabricated by the same method as described in the fifth example.

Eighth Example

Except that the respective surface-modifying aqueous solutions were varied to an aqueous solution including $(NH_4)_2HPO_4$ in an amount of 0.9% by mass when the entire aqueous solution was taken as 100% by mass and an aqueous solution including $Ba(NO_3)_2$ in an amount of 3.5% by mass when the entire aqueous solution was taken as 100% by mass, respectively, an active material according to an eighth example was obtained using the same method as described in the fifth example.

Using the active material obtained as above, a laminated-type lithium-ion secondary battery according to the eighth example was fabricated by the same method as described in the fifth example.

Ninth Example

Except that the respective surface-modifying aqueous solutions were varied to an aqueous solution including $(NH_4)_2HPO_4$ in an amount of 0.9% by mass when the entire aqueous solution was taken as 100% by mass and an aqueous solution including $Sr(NO_3)_2$ in an amount of 3.5% by mass when the entire aqueous solution was taken as 100% by mass, respectively, an active material according to a ninth example was obtained using the same method as described in the fifth example.

Using the active material obtained as above, a laminated-type lithium-ion secondary battery according to the ninth example was fabricated by the same method as described in the fifth example.

Tenth Example

Except that the respective surface-modifying aqueous solutions were varied to an aqueous solution including $(NH_4)_2HPO_4$ in an amount of 0.2% by mass when the entire aqueous solution was taken as 100% by mass and an aqueous solution including $Al(NO_3)_3$ in an amount of 0.7% by mass when the entire aqueous solution was taken as 100% by mass, respectively, an active material according to a tenth example was obtained using the same method as described in the fifth example.

Using the active material obtained as above, a laminated-type lithium-ion secondary battery according to the tenth example was fabricated by the same method as described in the fifth example.

Eleventh Example

Except that the respective surface-modifying aqueous solutions were varied to an aqueous solution including $(NH_4)_2HPO_4$ in an amount of 0.4% by mass when the entire aqueous solution was taken as 100% by mass and an aqueous solution including $Al(NO_3)_3$ in an amount of 1.4% by mass when the entire aqueous solution was taken as 100% by mass, respectively, an active material according to an eleventh example was obtained using the same method as described in the fifth example.

Using the active material obtained as above, a laminated-type lithium-ion secondary battery according to the eleventh example was fabricated by the same method as described in the fifth example.

Second Comparative Example

Other than using as an active material $LiNi_{5/10}Co_{2/10}Mn_{3/10}O_2$ per se (hereinafter, being sometimes referred to "an untreated product according to a second comparative example"), a laminated-type lithium-ion secondary battery according to a second comparative example was fabricated by the same method as described in the fifth example.

Second Evaluating Example

Initial capacities of the lithium-ion secondary batteries according to the fifth through eleventh examples and the second comparative examples were measured. A discharged capacity was measured when carrying out a CC discharging (i.e., constant-current discharging) mode or operation to each of the batteries to be measured at a rate of 0.33 C with a voltage of 3.0 V after carrying out a CCCV charging (i.e., constant-current and constant-voltage charging) mode or operation to each of the batteries at 25° C. at a rate of 0.33 C with a voltage of 4.5 V. The thus measured discharged capacities were labeled the initial capacities.

In addition, each of the batteries to be measured underwent a charging/discharging cycle for 200 cycles in which each of the batteries was charged and discharged at 60° C. at a rate of 1 C with a voltage falling in a range of from 4.32 V to 3.0 V. Thereafter, discharged capacities were measured under the same conditions as described in the measurement of the initial capacities after leaving each of the batteries at room temperature for five hours or more. The thus measured discharged capacities were labeled post-cycle capacities.

The capacity maintained rates (%) were found by the following equation.

Capacity Maintained Rate (%)={(Post-cycle Capacity)/(Initial Capacity)}×100

Table 2 shows results of measuring the Ni, Co and Mn composition ratios in the superficial layer of the active materials, the initial capacities, the post-200-cycle capacities, and the capacity maintained rates.

TABLE 2

| | Superficial-layer Composition Ratio | | | Initial | Post-cycle | Capacity |
|---|---|---|---|---|---|---|
| | Ni (b2) | Co (c2) | Mn (d2) | Capacity (mA · h/g) | Capacity (mA · h/g) | Maintained Rate (%) |
| 5th Ex. | 0.45 | 0.16 | 0.39 | 141.9 | 111.2 | 78.2 |
| 6th Ex. | 0.34 | 0.11 | 0.55 | 112.3 | 85.9 | 76.8 |
| 7th Ex. | 0.46 | 0.17 | 0.37 | 141.6 | 107.6 | 76.1 |
| 8th Ex. | 0.43 | 0.16 | 0.41 | 138.3 | 106.4 | 76.8 |
| 9th Ex. | 0.45 | 0.17 | 0.39 | 141.3 | 108.6 | 76.9 |
| 10th Ex. | 0.47 | 0.15 | 0.38 | 145.2 | 112.4 | 77.2 |
| 11th Ex. | 0.48 | 0.15 | 0.38 | 144.0 | 109.6 | 76.4 |
| 2nd Comp. Ex. | 0.50 | 0.20 | 0.30 | 146.9 | 111.6 | 76.0 |

The Ni, Co and Mn composition ratios in the superficial layer of the active materials were computed by means of measuring the surface of the active materials by an X-ray photoelectric spectroscopy. Moreover, the following were also ascertained using a TEM-EDX analysis: the internal composition ratios of the active materials were not changed; and the detected signals of Mg, Ba, Sr, Al and P used in the treatment step were the detection limits or less of the TEM-EDX analysis at the superficial layer and interior. In the fifth through eleventh examples as well, in the superficial layer of an active material being obtainable at the specific treatment step, an element added from the outside is not said to develop the new performance, but a modified surface done by elements included therein from the very beginning is said to enable the functional improvements to be demonstrated.

When comparing the fifth through eleventh examples with the second comparative example on the Ni, Co and Mn composition ratios in the superficial layer of the active materials, the Mn composition was found out to become high even in any of the examples, whereas the Co composition was found out to become low therein on the contrary. And, when comparing the fifth through eleventh examples with the second comparative example on the capacity maintained rates, the capacity maintained rates were found out to be upgraded more even in any of the examples than in the comparative example. From the results, making the Mn composition ratio in the superficial layer of an active material higher than the Mn composition ratio of the original (or in the internal) active material is said to result in turning the active material into an active material exhibiting a favorable capacity maintained rate.

Note that, in the secondary battery according to the examples, the secondary batteries (like the seventh example), in which only slight improvements were observed on the capacity maintained rates, compared with the secondary battery according to the second comparative example, at the time after 200 cycles passed, are present. However, in charging/discharging cycles after going beyond 200 cycles, the improvements on the capacity maintained rates are predicted to expand furthermore. And, since practical secondary batteries are expected to maintain satisfiable capacities even in charging/discharging cycles after going beyond 200 cycles, even such an extent of the capacity-maintained-rate improvement observed in the seventh example is a beneficial effect.

The results of testing shown in Table 1 and Table 2 do not at all contradict with such characteristics of Mn in an active material as "Mn is the most inactive at the time of Li charging/discharging reactions. Although the greater the Mn content is within an active material the more the capacity declines, the greater the Mn content is within an active material the more the active material excels in the stability contrarily."

Note here in that, for a lithium composite metallic oxide having a lamellar rock-salt structure and expressed by $LiNi_bCo_cMn_dO_2$, the following lattice-energy differences are computed using the first principles calculation under the following conditions: initial lattice-energy differences (or "initial-$\Delta H$") in the respective compositions of Ni, Co and Mn; and lattice-energy differences (or "Li-Separation-$\Delta H$") when 2/3 of lithium has separated from the lithium composite metallic oxide. Table 3 shows the results. Note that a "lattice-energy difference (or -$\Delta H$)" means a difference between an energy of $LiNi_bCo_cMn_dO_2$ with a lamellar rock-salt structure and another energy when lithium is separated and then each of Ni, Co and Mn is oxidized so that the lamellar rock-salt structure has collapsed.

Software: Quantum Espresso (PWscf)
Exchange-correlation Interaction: GGAPBE Functional
Calculation Method: PAW (i.e., Project Augmented Wave)
Method
Wave-function Cut-off: 50 Ry

TABLE 3

| Entry | Ni: "b" | Co: "c" | Mn: "d" | Initial − ΔH | Li-separation − ΔH |
|---|---|---|---|---|---|
| Entry 1-1 | 0.56 | 0.11 | 0.33 | 87.41 | 51.49 |
| Entry 1-2 | 0.56 | 0.17 | 0.28 | 86.73 | 50.82 |
| Entry 1-3 | 0.56 | 0.22 | 0.22 | 86.14 | 50.25 |
| Entry 2-1 | 0.50 | 0 | 0.50 | 89.26 | 53.99 |
| Entry 2-2 | 0.50 | 0.11 | 0.39 | 88.34 | 52.75 |
| Entry 2-3 | 0.50 | 0.17 | 0.33 | 87.88 | 52.15 |
| Entry 2-4 | 0.50 | 0.22 | 0.28 | 87.29 | 51.60 |
| Entry 2-5 | 0.50 | 0.28 | 0.22 | 86.70 | 51.03 |
| Entry 3-1 | 0.44 | 0.11 | 0.44 | 89.21 | 54.06 |
| Entry 3-2 | 0.44 | 0.17 | 0.39 | 88.76 | 53.46 |
| Entry 3-3 | 0.44 | 0.22 | 0.33 | 88.33 | 52.81 |
| Entry 3-4 | 0.44 | 0.28 | 0.28 | 87.73 | 52.25 |
| Entry 3-5 | 0.44 | 0.33 | 0.22 | 87.24 | 51.68 |
| Entry 4-1 | 0.39 | 0.22 | 0.39 | 89.17 | 54.12 |
| Entry 4-2 | 0.39 | 0.28 | 0.33 | 88.75 | 53.48 |
| Entry 4-3 | 0.39 | 0.33 | 0.28 | 88.26 | 52.90 |
| Entry 5-1 | 0.33 | 0.33 | 0.33 | 89.16 | 54.17 |
| Entry 5-2 | 0.33 | 0.44 | 0.22 | 88.19 | 53.01 |

From the results in Entry 1-1 through Entry 1-3, the composition with a high Mn ratio is found out to have a larger value of "Li-separation-$\Delta H$" than does the composition with a low Mn ratio when the Ni composition is constant. The same is find out from the results in Entry 2-1 through Entry 2-5, Entry 3-1 through Entry 3-5, Entry 4-1 through Entry 4-3, and Entry 5-1 through Entry 5-2. Note here in that, when Ni is constant, a lithium composite metallic oxide with a high Mn composition has been ascertained theoretically to be stable in the lithium composite metallic oxide having a lamellar rock-salt structure and expressed by $LiNi_bCo_cMn_dO_2$, because the larger the value of "Li-separation–ΔH" is the more stable the lamellar rock-salt structure is.

In consideration of the results of the first principles calculation, the advantageous effect of improving the capacity maintained rates shown by the examples according to the present invention owes to the fact that an Mn composition becomes high in the superficial layer of the active materials according to the present invention. That is, the advantageous effect is said to arise as a consequence of the following: a lamellar rock-salt structure in the active-material superficial layer is stabilized more and accordingly the lamellar rock-salt structure of the present active materials is maintained suitably even after undergoing the cyclic charging/discharging mode or operation.

Therefore, the results shown by the examples are believed to be valid not only for the $LiNi_{1/3}Co_{1/3}Mn_{1/3}O_2$ and $LiNi_{5/10}Co_{2/10}Mn_{3/10}O_2$ used actually but also for each and every material expressed by the general formula: $Li_aNi_bCo_cMn_dD_eO_f$ (where $0.2 \leq "a" \leq 1$, "b"+"c"+"d"+"e"=1, $0 \leq "e" < 1$, "D" is at least one element selected from the group consisting of Li, Fe, Cr, Cu, Zn, Ca, Mg, Zr, S, Si, Na, K and Al, and $1.7 \leq "f" \leq 2.1$).

From the aforementioned results, namely, the present lithium-ion secondary batteries using the active materials according to the present invention exhibited favorable capacity maintained rates, the secondary batteries were ascertained to excel in the cyclability. Moreover, the present active materials were ascertained to be able to maintain the capacities suitably even under the driving or operating condition at such a high potential as 4.3 V or 4.5 V.

Next, a suitable high manganese portion is hereinafter investigated. Table 4 shows the relationships between the prior-to-surface-modification and post-surface-modification Ni, Co and Mn compositions based on the results according to the first through eleventh examples. Note that the lower parenthesized lines in the columns designated with "Superficial-layer Composition Ratio" show relationships with the prior-to-surface-modification compositions. For example, Ni("b2") according to the first example means to multiply 0.33, a prior-to-surface-modification composition, by 0.96.

TABLE 4

| | Superficial-layer Composition Ratio | | | Initial Capacity (mA · h/g) | Capacity Maintained Rate (%) |
|---|---|---|---|---|---|
| | Ni ("b2") | Co ("c2") | Mn ("d2") | | |
| 1st Ex. | 0.32 (0.33 × 0.96) | 0.21 (0.33 × 0.63) | 0.47 (0.33 × 1.41) | 172.7 | 78.5 |
| 2nd Ex. | 0.28 (0.33 × 0.84) | 0.10 (0.33 × 0.3) | 0.62 (0.33 × 1.86) | 157.5 | 79.4 |
| 3rd Ex. | 0.45 (0.33 × 1.35) | 0.17 (0.33 × 0.51) | 0.38 (0.33 × 1.14) | 160.2 | 72.6 |
| 4th Ex. | 0.31 (0.33 × 0.93) | 0.25 (0.33 × 0.75) | 0.44 (0.33 × 1.32) | 165.8 | 60.6 |
| 1st Comp. Ex. | 0.33 | 0.33 | 0.33 | 177.3 | 48.3 |
| 5th Ex. | 0.45 (0.5 × 0.9) | 0.16 (0.2 × 0.8) | 0.39 (0.3 × 1.3) | 141.9 | 78.2 |
| 6th Ex. | 0.34 (0.5 × 0.68) | 0.11 (0.2 × 0.55) | 0.55 (0.3 × 1.8) | 112.3 | 76.8 |
| 7th Ex. | 0.46 (0.5 × 0.92) | 0.17 (0.2 × 0.85) | 0.37 (0.3 × 1.23) | 141.6 | 76.1 |
| 8th Ex. | 0.43 (0.5 × 0.86) | 0.16 (0.2 × 0.8) | 0.41 (0.3 × 1.37) | 138.3 | 76.8 |
| 9th Ex. | 0.45 (0.5 × 0.9) | 0.17 (0.2 × 0.85) | 0.39 (0.3 × 1.3) | 141.3 | 76.9 |
| 10th Ex. | 0.47 (0.5 × 0.94) | 0.15 (0.2 × 0.75) | 0.38 (0.3 × 1.27) | 145.2 | 77.2 |
| 11th Ex. | 0.48 (0.5 × 0.96) | 0.15 (0.2 × 0.75) | 0.38 (0.3 × 1.27) | 144.0 | 76.4 |
| 2nd Comp. Ex. | 0.5 | 0.2 | 0.3 | 146.9 | 76.0 |

The prior-to-surface-modification compositions of Ni, Co, and Mn are labeled "b," "c," and "d," respectively.

In Table 4, "b2" falls within a range of 0.68×"b"≤"b2"≤1.35×"b". Hence, "b2" making both of the initial capacity and capacity maintained rate suitable is presumed to fall within a range of 0.88×"b"<"b2"≤0.96×"b".

In Table 4, "c2" falls within a range of 0.3×"c"≤"c2"≤0.85×"c". Hence, "c2" making both of the initial capacity and capacity maintained rate suitable is presumed to fall within a range of 0.63×"c"≤"c2"≤0.85×"c".

In Table 4, "d2" falls within a range of 1.14×"d"≤"d2"≤1.86×"d". Hence, "d2" making both of the initial capacity and capacity maintained rate suitable is presumed to fall within a range of 1.2×"d"<"d2"≤1.41×"d".

Third Evaluating Example

The particles of the active material according to the first example and the particles of the untreated product according to the first comparative example were provided with a cross section, respectively, by an Ar-ion milling method using an ion slicer (e.g., "EM-09100IS," a product of NIHON DENSHI Co., Ltd.), and then an analysis on the cross sections was executed by a TEM-EDX. Table 5 lists results of the analysis at sites of which the distance from the active-material superficial layer was 5 nm and 20 nm. Note that the values of Ni, Co and Mn in Table 5 are percentages of the respective metals with respect to the summed amounts of Ni, Co and Mn. Moreover, the values of O therein are percentages of O with respect to the summed amounts of Ni, Co, Mn and O.

TABLE 5

| | | 5 nm | 20 nm |
|---|---|---|---|
| 1st Ex. | Ni | 32.66% | 31.74% |
| | Co | 24.32% | 35.18% |
| | Mn | 43.02% | 33.08% |
| | O | 62.44% | 51.92% |
| Untreated Product | Ni | 34.14% | 34.50% |
| | Co | 33.64% | 34.23% |
| | Mn | 33.22% | 31.27% |
| | O | 49.71% | 49.59% |

The present active material was confirmed to have a low Co ratio but a high Mn ratio in the vicinity of the superficial layer. Moreover, the superficial-layer-vicinity oxygen ratio was confirmed to be high.

Fourth Evaluating Example

Using a high-angle scattering annular dark-field scanning transmission electron microscope (e.g., "JEM-ARM200F"

produced by NIHON DENSHI Co., Ltd. (or JEOL)), the superficial layer of the active material according to the first example was measured with an acceleration voltage of 200 kV while carrying out the spherical aberration correction.

Figure 2:
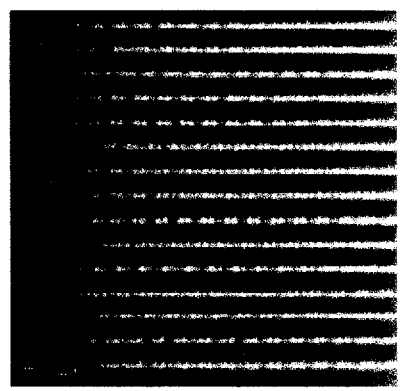
FIG. 2 is an image corresponding to a lamellar-rock-salt-structure 3b-site plane which is constituted of the present first through third superlattice-structure portions observed by a high-angle scattering annular dark-field scanning transmission electron microscopy.

FIG. 2 shows an image obtained by observing the 3b sites in the lamellar rock-salt structure of the active material from a <1-100> orientation by means of a high-angle scattering annular dark-field scanning transmission electron spectroscopy, the image corresponding to the first through third superlattice-structure portions according to the present invention. The long side of a rectangular parallelepiped present on the lower left in FIG. 2 has a length of 1 nm.

Figure 3:
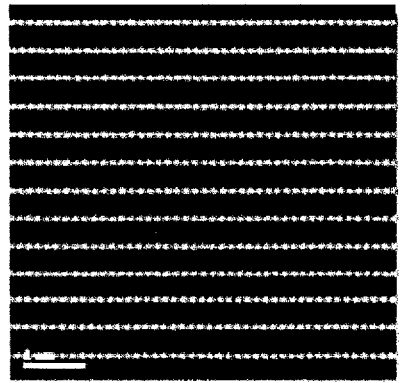
FIG. 3 is an image of a lamellar-rock-salt-structure 3b-site plane comprising an ordinary superlattice plane which is observed by a high-angle scattering annular dark-field scanning transmission electron microscopy, wherein commercially available lamellar rock-salt-type $LiNi_{1/3}Co_{1/3}Mn_{1/3}O_2$ was measured.

For comparison, FIG. 3 shows an image of an ordinary superlattice plane obtained by observing the 3b sites in the lamellar rock-salt structure of commercial available $LiNi_{1/3}Co_{1/3}Mn_{1/3}O_2$ per se from a <1-100> orientation. The long side of a rectangular parallelepiped present on the lower left in FIG. 3 has a length of 1 nm.

When comparing the images in FIG. 2 and FIG. 3 with each another, images with comparable strengths are observed regularly in FIG. 3, whereas images with "light, light and dark" strengths making a set were observed periodically.

Figure 4:
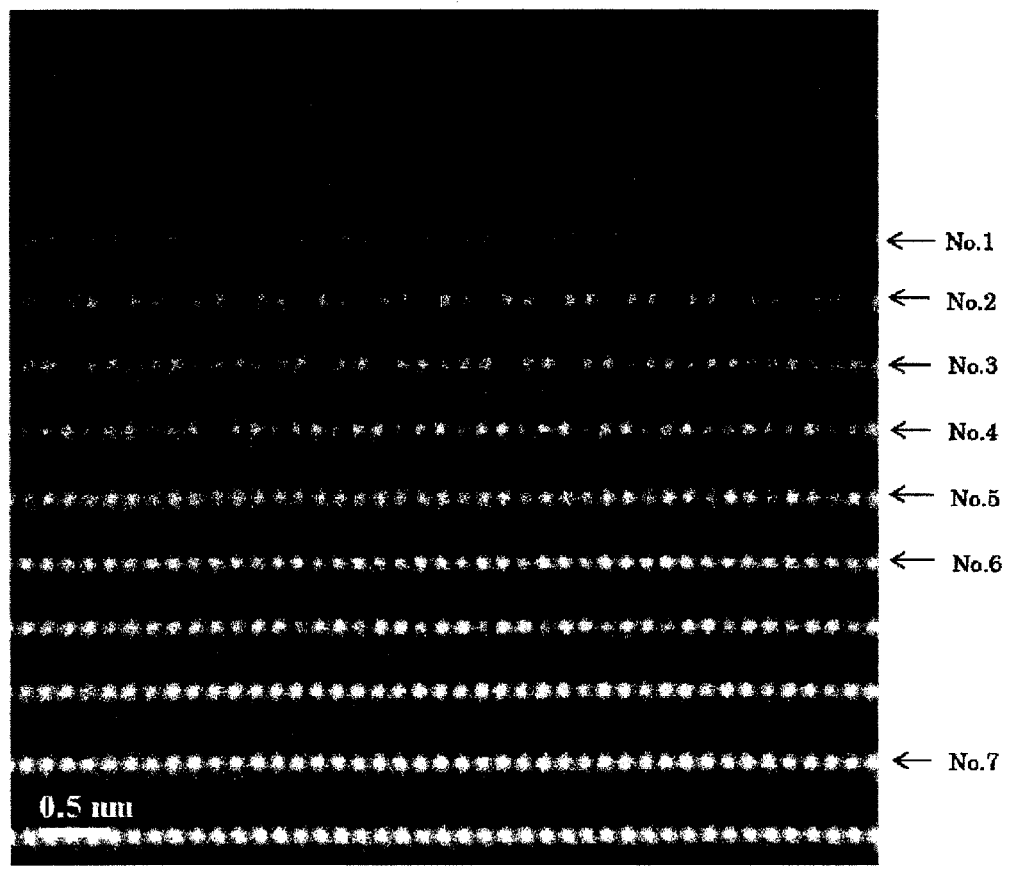
FIG. 4 is an image in the vicinity of a boundary between an ordinary superlattice plane and the present first through third superlattice-structure portions which were observed by a high-angle scattering annular dark-field scanning transmission electron microscopy.

FIG. 4 shows an image of the interface between a phase comprising the crystal construction including the first through third superlattice-structure portions according to the present invention and another phase comprising a crystal structure including an ordinary superlattice plane, the image obtained by observing the 3b sites in the lamellar rock-salt structure of the present active material from a <1-100> orientation.

FIG. 5 shows data on integrated strengths of the 3b-site images labeled Nos. 1 through No. 7 in FIG. 4. Note that Nos. 1 through 7 in FIG. 4 and FIG. 5 are labels designated for convenience. For example, No. 1 is not at all a label meaning the outermost surface of the present active material.

The numerical values in FIG. 5 is hereinafter described. "1004416" in the line labeled No. 1 is an integrated strength appeared at a site "a" labeled for convenience. The numerical values mean integrated strengths being continuous in the order of from "a" to "b," "c," and so on. The numerical values set forth in the columns under the integrated strengths are strength ratios. For example, "0.822" set forth in the column under the integrated strength of "c" is a strength ratio obtained by dividing a minimum value of the three continuous integrated strengths of "a," "b" and "c" by a maximum value thereof. "0.813" set forth in the column under the integrated strength of "d" is a strength ratio obtained by dividing a minimum value of the three continuous integrated strengths of "b," "c" and "d" by a maximum value thereof. The respective averaged values "n" in the most right column in the table are averaged values of the respective seven sets in which the aforementioned strength ratios make seven constituent members.

In FIG. 5, Nos. 1 through 4 of which the averaged values "n" satisfy such a condition as being less than 0.9 make the first superlattice-structure portion according to the present invention.

Moreover, in FIG. 5, "a," "b" and "c" in the line labeled No. 1, "b," "c" and "d" in the line labeled No. 2, "d," "e" and "f" in the line labeled No. 3, and "c," "d" and "e" in the line labeled No. 4, for instance, satisfy the condition on the second superlattice-structure portion according to the present invention.

Hence, the active material according to the first example comprised the first through third superlattice-structure portions according to the present invention as shown in the lines labeled Nos. 1 through 4 in FIG. 5.

Twelfth Example

Aforementioned Treatment 1 was followed, thereby carrying out the following treatments to a lithium composite metallic oxide serving as a starting substance.

A lithium composite metallic oxide made by a coprecipitation method and expressed by $LiNi_{1/3}Co_{1/3}Mn_{1/3}O_2$ was readied. Surface-modifying aqueous solutions including $(NH_4)_2HPO_4$ in an amount of 4.0% by mass and $Mg(NO_3)_2$ in an amount of 5.8% by mass when each of the aqueous solutions was taken entirely as 100% mass were prepared, respectively. The lithium composite metallic oxide was immersed into the surface-modifying aqueous solutions, and was then stirred in the aqueous solutions and mixed therewith at room temperature. The immersion time was set at 30 minutes.

A filtration was carried out after the immersion. Subsequently, the surface-modified lithium composite metallic oxide was dried at 130° C. f or six hours. Thereafter, the obtained lithium composite metallic oxide was heated at 700° C. under an air atmosphere for five hours. A product obtained by the treatments was labeled an active material according to a twelfth example.

A lithium-ion secondary battery according to the twelfth example was fabricated in the following manner.

A positive electrode was made as described below.

An aluminum foil with a thickness of 20 μm was readied to serve as a current collector for positive electrode. The following were mixed one another: the active material according to the twelfth example in an amount of 94 parts by mass; acetylene black (or AB) serving as a conductive additive in an amount of three parts by mass; and polyvinylidene fluoride (or PVdF) serving as a binder in an amount of three parts by mass. The mixture was dispersed in a proper amount of N-methyl-2-pyrrolidone (or NMP), thereby preparing a slurry. The aforementioned slurry was put on a surface of the aforementioned aluminum foil, and then the slurry was coated thereon so as to be in the shape of a film using a doctor blade. The NMP was removed by means of volatilization by drying the aluminum foil with the slurry coated at 80° C. for 20 minutes, thereby forming an active-material layer on the aluminum-foil surface. The aluminum foil with the active-material layer formed on the surface was compressed using a roll pressing machine, thereby adhesion joining the aluminum foil and the active-material layer firmly with each other. The joined substance was heated at 120° C. for 12 hours or more with a vacuum drier, and was then cut out to a predetermined configuration (e.g., a circular shape with 14 mm in diameter), thereby obtaining a positive electrode.

A negative electrode was made as described below.

The following were mixed one another: graphite in an amount of 97 parts by mass; KB serving as a conductive additive in an amount of one part by mass; and styrene-butadiene rubber (or SBR) as well as carboxymethyl cellulose (or CMC) in an amount of 20/17 part by mass and 14/17 parts by mass, respectively, the two serving as a binding agent. The mixture was dispersed in a proper amount of ion-exchanged water to prepare a slurry. The slurry was coated onto a copper foil with a thickness of 20 g m (i.e., a current collector for negative electrode) so as to be in the shape of a film using a doctor blade. The copper foil with the slurry coated thereon was dried, and was thereafter pressed.

The joined substance was heated at 200° C. for two hours with a vacuum drier, and was then cut out to a predetermined configuration (e.g., a circular shape with 14 mm in diameter), thereby making a negative electrode.

Using the above-mentioned positive electrode and negative electrode, a coin-type lithium-ion secondary battery was manufactured. To be concrete, a rectangle-shaped sheet serving as a separator and comprising a polypropylene/polyethylene/polypropylene three-layered-construction resinous film was interposed or held between the positive electrode and the negative electrode, thereby making a polar-plate subassembly. After putting the polar-plate subassembly in a coin-type case and then injecting an electrolytic solution into the coin-type case, the coin-type case was closed hermetically. As for the electrolytic solution, a solution was used: the solution comprised a solvent in which ethylene carbonate (or EC), and diethyl carbonate (or DEC) had been mixed one another in such a ratio as EC:DEC=3:7 by volume; and $LiPF_6$ dissolved in the solvent so as to make 1 mol/L.

Via the above steps, the coin-type lithium-ion secondary battery according to the twelfth example was fabricated.

Thirteenth Example

Aforementioned Treatment 2 was followed, thereby carrying out the following treatments to a lithium composite metallic oxide serving as a starting substance.

A lithium composite metallic oxide made by a coprecipitation method and expressed by $LiNi_{1/3}Co_{1/3}Mn_{1/3}O_2$ was readied. A surface-modifying aqueous solution including $(NH_4)_2HPO_4$ in an amount of 37% by mass was prepared. The lithium composite metallic oxide was immersed into the surface-modifying aqueous solution, and was then stirred in the aqueous solution and mixed therewith at room temperature. The immersion time was set at 30 minutes.

A filtration was carried out after the immersion. Subsequently, the surface-modified lithium composite metallic oxide was dried at 130° C. for six hours. Thereafter, the obtained lithium composite metallic oxide was heated at 700° C. under an air atmosphere for five hours. A product obtained by the treatments was labeled an active material according to a thirteenth example.

Other than employing the active material according to the thirteenth example as an active material, a coin-type lithium-ion secondary battery according to the thirteenth example was hereinafter fabricated by the same production method as described in the twelfth example.

Third Comparative Example

Other than using $LiNi_{1/3}Co_{1/3}Mn_{1/3}O_2$ per se (e.g., a commercially available product (hereinafter, being sometimes referred to "an untreated product according to a third comparative example")) for an active material, a coin-type lithium-ion secondary battery according to a third comparative example was fabricated by the same method as described in the twelfth example. Note that the treatment according to the present invention was not done to the commercially available product at all.

Fourth Comparative Example

Other than employing an aqueous solution including $(NH_4)_2HPO_4$ in an amount of 5.4% by mass as a surface-modifying aqueous solution, an active material and coin-type lithium-ion secondary battery according to a fourth comparative example were fabricated by the same production method as described in the thirteenth example.

Fifth Evaluating Example

Figure 7:
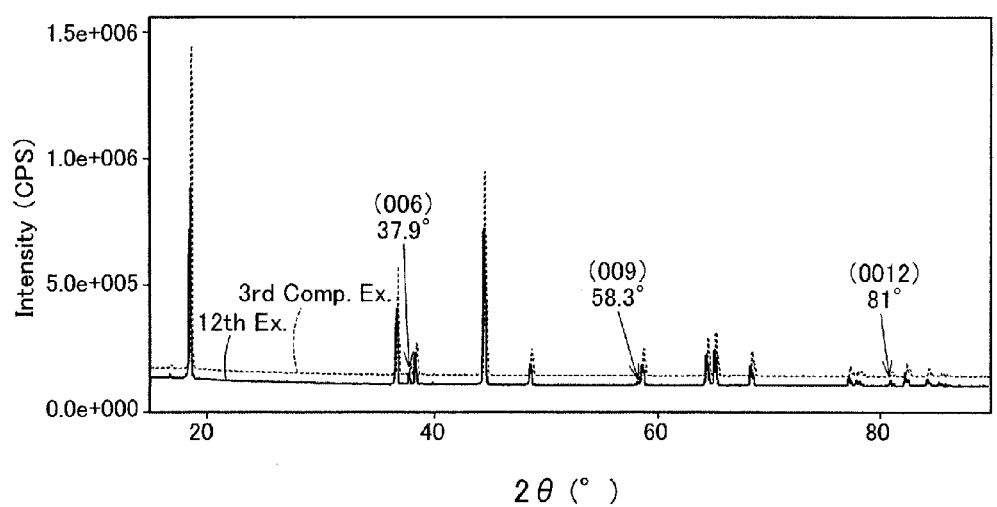
FIG. 7 is an X-ray diffraction pattern of an active material according to a twelfth example, and an X-ray diffraction pattern of an untreated product according to a third comparative example.

The active materials according to the fifth, seventh, ninth, tenth, twelfth and thirteenth examples, the untreated products according to the second and third comparative examples, and the active material according to the fourth comparative example were measured for X-ray diffraction patterns by an X-ray diffraction apparatus (e.g., "SmartLab" produced by RIGAKU Corporation). FIG. 7 shows the X-ray diffraction patterns of the active material according to the twelfth example and untreated product according to the third comparative example. In FIG. 7, the solid line is the diffraction pattern of the active material according to the twelfth example, and the dotted line is the diffraction pattern of the untreated product according to the third comparative example. From among the respective diffraction patterns, peaks of the (006), (009) and (0012) crystal planes derived from the lamellar rock-salt crystal structure of the lithium composite metallic oxide were detected. Using above-mentioned Equation (4), c-axis-direction heterogeneous strains $\eta_c$ were computed from integrated widths $\beta$ of the three peaks. Moreover, all-round-direction heterogeneous strains $\eta$ were computed from integrated widths $\beta$ of all peaks derived from the lamellar rock-salt crystal structure of the lithium composite metallic oxide, the peaks detected in the measurement field where $2\theta$ was from 5 degrees up to 90 degrees. Table 6 shows the materials before the treatments according to the present invention, the c-axis-direction heterogeneous strains $\eta_c$, the all-round-direction heterogeneous strains $\eta$, and the ratios $\eta_c/\eta$, regarding the respective active materials.

TABLE 6

|  | Prior-to-Present-Treatment Product *) | $\eta_c$ | $\eta$ | $\eta_c/\eta$ |
|---|---|---|---|---|
| 5th Ex. | $Ni_{5/10}Co_{2/10}Mn_{3/10}$ | 0.05 | 0.09 | 0.56 |
| 7th Ex. | $Ni_{5/10}Co_{2/10}Mn_{3/10}$ | 0.05 | 0.08 | 0.63 |
| 9th Ex. | $Ni_{5/10}Co_{2/10}Mn_{3/10}$ | 0.04 | 0.08 | 0.50 |
| 10th Ex. | $Ni_{5/10}Co_{2/10}Mn_{3/10}$ | 0.04 | 0.09 | 0.44 |
| 2nd Comp. Ex. | $Ni_{5/10}Co_{2/10}Mn_{3/10}$ | 0.08 | 0.09 | 0.89 |
| 12th Ex. | $Ni_{1/3}Co_{1/3}Mn_{1/3}$ | 0.059 | 0.063 | 0.94 |
| 13th Ex. | $Ni_{1/3}Co_{1/3}Mn_{1/3}$ | 0.075 | 0.087 | 0.86 |
| 3rd Comp. Ex. | $Ni_{1/3}Co_{1/3}Mn_{1/3}$ | 0.033 | 0.040 | 0.83 |
| 4th Comp. Ex. | $Ni_{1/3}Co_{1/3}Mn_{1/3}$ | 0.040 | 0.059 | 0.68 |

*) Note that "$Ni_{5/10}Co_{2/10}Mn_{3/10}$" addresses the instance where the prior-to-present-treatment material was $LiNi_{5/10}Co_{2/10}Mn_{3/10}O_2$. Moreover, "$Ni_{1/3}Co_{1/3}Mn_{1/3}$" addresses the instance where the prior-to-present-treatment material was $LiNi_{1/3}Co_{1/3}Mn_{1/3}O_2$. In addition, the lines labeled "2nd Comp. Ex. and 3rd Comp. Ex." address the materials used for reference, although no treatment according to the present invention was carried out to the comparative examples.

When the material undergone the treatment according to the present invention was $LiNi_{5/10}Co_{2/10}Mn_{3/10}O_2$, the treatment according to the present invention was found out to make the values of $\eta_c$ and $\eta_c/\eta$ small. On the other hand, when the material undergone the treatment according to the present invention was $LiNi_{1/3}Co_{1/3}Mn_{1/3}O_2$, the treatment according to the present invention was found out to make the c-axis-direction heterogeneous strains $\eta_c$ and all-round-direction heterogeneous strains $\eta$ large, and thereby the values of $\eta_c/\eta$ changed.

Sixth Evaluating Example

Figure 8:
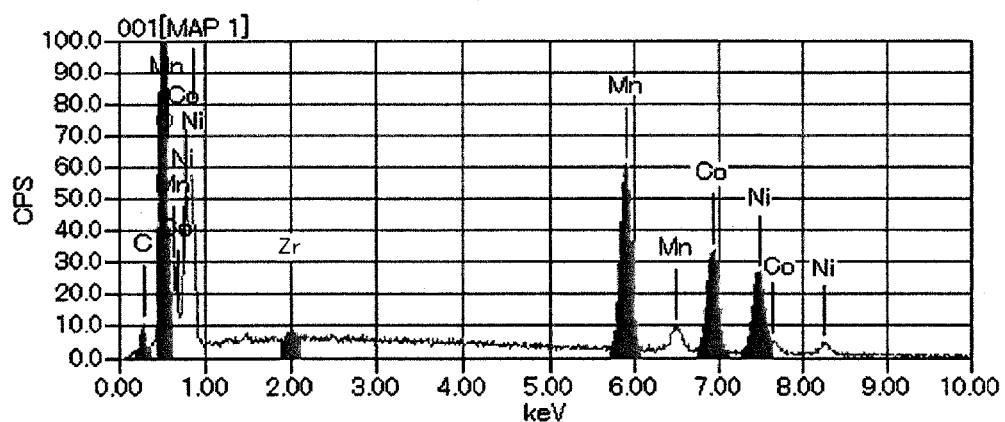
FIG. 8 is an SEM-EDX chart of the active material according to the twelfth example, and an SEM-EDX chart of the untreated product according to the third comparative example.
Figure 8:
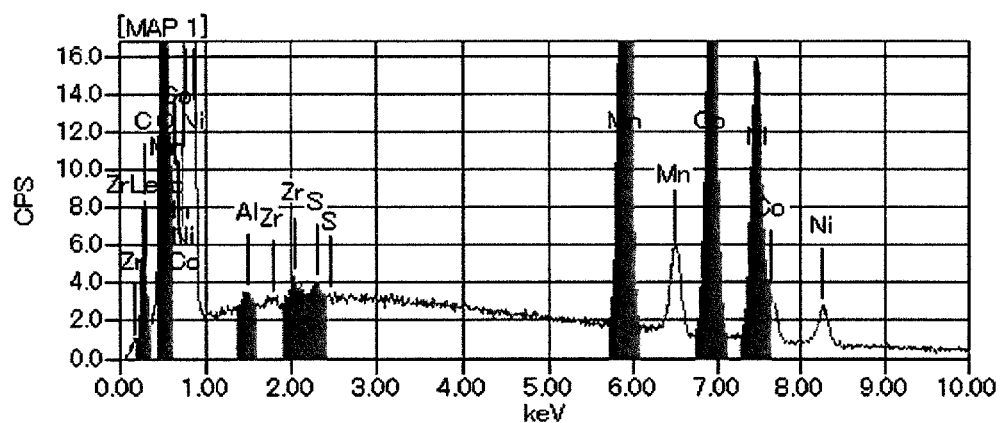

To the active material according to the twelfth example and untreated product according to the third comparative example, a composition analysis was carried out by an SEM-EDX method. FIG. 8 shows a chart on results of the analyses. The compositions of both of the active material according to the twelfth example and untreated product according to the third comparative example were the same with each virtually. However, in the active material according to the twelfth example, peaks derived from impurities such as S, Al and Zr were hardly observed, the peaks observed in the untreated product according to the third comparative example.

Seventh Evaluating Example

The lithium-ion secondary batteries according to the twelfth and thirteenth examples, and the lithium-ion secondary batteries according to the third and fourth comparative examples were evaluated by the same method as described in the first evaluating example. However, the charging/discharging cycle was set to be done 50 cycles.

Table 7 shows the results.

TABLE 7

|  | Initial Capacity (mA · h/g) | Post-cycle Capacity (mA · h/g) | Capacity Maintained Rate (%) |
| --- | --- | --- | --- |
| 12th Ex. | 165 | 136 | 82% |
| 13th Ex. | 160 | 105 | 66% |
| 3rd Comp. Ex. | 168 | 78 | 46% |
| 4th Comp. Ex. | 172 | 72 | 42% |

Taking the results shown in Table 6 and Table 7 into consideration altogether, the treatment according to the present invention was found out to make the $\eta_c$ and $\eta$ values of the active material large, and thereby the capacity maintained rates of the lithium-ion secondary batteries comprising the active material changed, when the material undergone the treatment according to the present invention was $LiNi_{1/3}Co_{1/3}Mn_{1/3}O_2$. And, the capacity maintained rate of a lithium-ion secondary battery comprising an active material was found to become remarkably excellent, when the $\eta_c/\eta$ value of the active material became 0.86 or more.

Moreover, Table 8 below shows the results shown in FIG. 6 along with the results shown in Table 2, regarding the lithium-ion secondary batteries according to the fifth, seventh, ninth and tenth examples as well as the second comparative example. From the results shown in Table 8, the treatment according to the present invention was found out to make the $\eta_c/\eta$ values of the active material small, and thereby the capacity maintained rates of the lithium-ion secondary batteries comprising the active material changed, when the material undergone the treatment according to the present invention was $LiNi_{5/10}Co_{2/10}Mn_{3/10}O_2$. And, the capacity maintained rate of a lithium-ion secondary battery comprising an active material was found to become excellent, when the $\eta_c/\eta$ value of the active material falls in a range of from 0.44 to 0.69.

TABLE 8

|  | $\eta_c$ | $\eta$ | $\eta_c/\eta$ | Initial Capacity (mA · h/g) | Post-cycle Capacity (m · Ah/g) | Capacity Maintained Rate (%) |
| --- | --- | --- | --- | --- | --- | --- |
| 5th Ex. | 0.05 | 0.09 | 0.56 | 141.9 | 111.2 | 78.2 |
| 7th Ex. | 0.05 | 0.08 | 0.63 | 141.6 | 107.6 | 76.1 |
| 9th Ex. | 0.04 | 0.08 | 0.50 | 141.3 | 108.6 | 76.9 |
| 10th Ex. | 0.04 | 0.09 | 0.44 | 145.2 | 112.4 | 77.2 |

TABLE 8-continued

|  | $\eta_c$ | $\eta$ | $\eta_c/\eta$ | Initial Capacity (mA · h/g) | Post-cycle Capacity (m · Ah/g) | Capacity Maintained Rate (%) |
| --- | --- | --- | --- | --- | --- | --- |
| 2nd Comp. Ex. | 0.08 | 0.09 | 0.89 | 146.9 | 111.6 | 76.0 |

Moreover, in the aforementioned first and twelfth examples, the time for immersing the lithium composite metallic oxide into the surface-modifying aqueous solutions was 30 minutes and one hour, respectively. Note herein that no great battery-performance difference resulting from the immersing-time difference was ascertained because any of the secondary batteries according to the first and twelfth examples had the remarkably excellent capacity maintained rates (see Table 1 and Table 7).

In addition, in the aforementioned first and twelfth examples, the types of the secondary batteries were a laminated type and a coin type, respectively. Note herein that no great battery-performance difference resulting from the secondary-battery-type difference was ascertained because any of the secondary batteries according to the first and twelfth examples had the remarkably excellent capacity maintained rates as described above. That is, regardless of categories of the types, such as cylindrical types, rectangular types, coin types and laminated types, a lithium-ion secondary battery using the present active material exhibits an excellent capacity maintained rate.

Note that, in the present description, the secondary-battery evaluations were executed to three samples (namely, "n"=3) for the respective secondary batteries. And, the initial capacities and post-cycle capacities set forth in the respective tables were averaged values for each "n"=3. Moreover, various factors, such as differences between raw-material lots and testing dates, have been well known commonly to cause fluctuations in the initial capacity and post-cycle capacity, as well as in the capacity maintained rate. For example, in the present evaluating examples, the potential occurrence of fluctuations from 10 to 15 mA·h/g approximately in the initial capacity and post-cycle capacity has been ascertained already even when the retests are carried out under the identical testing conditions. Although the fluctuations influence fluctuations in the capacity maintained rate as well, saying is possible that the benefits that the present invention effects are universal benefits to various outer disturbance factors, because the benefits of improvements resulting from the present invention and the tendencies thereof do not change at all.

The invention claimed is:

1. An active material having a lamellar rock-salt structure comprising a superficial layer including the outermost surface of the active material,
   wherein the outermost surface is a high manganese portion;
   the active material present in a location other than where the high manganese portion exists is expressed by a general formula, $Li_aNi_bCo_cMn_dD_eO_f$ (where $0.2 \leq$"a"$\leq 1$, "b"+"c"+"d"+"e"=1, $0 \leq$"e"$<1$, "D" is at least one element selected from the group consisting of Li, Fe, Cr, Cu, Zn, Ca, Mg, Zr, S, Si, Na, K and Al, and $1.7 \leq$"f"$\leq 2.1$);
   the high manganese portion is made of a metallic oxide including Ni, Co and Mn at least and of which the composition ratio between Ni, Co and Mn is expressed by Ni:Co:Mn =b2:c2:d2 (where "b2"+"c2"+"d2"=1, 0<"b2"<1, 0<"c2"<"c", and "d"<"d2"<1); and a layer of the high manganese portion having a thickness "$s_1$" (nm) falling in such a range as 0<"$s_1$"<20, wherein, if the active material exhibits a concentration gradient over the entire region from the center to the surface, the high manganese portion is excluded from the concentration gradient.

2. A production process for the active material or lithium composite metallic oxide as set forth in claim 1, the production process comprising any of following Treatments 1 through 4 carried out to a material having a lamellar rock-salt structure, and expressed by a general formula, $Li_aNi_bCo_cMn_dD_eO_f$ (where 0.2≤"a"≤1, "b"+"c"+"d"+"e"=1, 0 ≤"e"<1, "D" is at least one element selected from the group consisting of Li, Fe, Cr, Cu, Zn, Ca, Mg, Zr, S, Si, Na, K and Al, and 1.7≤"f"≤2.1):

(Treatment 1) comprising the steps of:
1-1) readying an acidic metallic salt aqueous solution;
1-2) mixing the metallic salt aqueous solution with a material expressed by the aforementioned general formula;
1-3) mixing a liquid obtained at said step 1-2) with an ammonium-phosphate salt aqueous solution; and
1-4) isolating the aforementioned material from another liquid obtained at said step 1-3);

(Treatment 2) comprising the steps of:
2-1) readying an ammonium-phosphate salt aqueous solution;
2-2) mixing the ammonium-phosphate salt aqueous solution with a material expressed by the aforementioned general formula;
2-3) mixing a liquid obtained at said step 2-2) with an acidic metallic salt aqueous solution; and
2-4) isolating the aforementioned material from another liquid obtained at said step 2-3);

(Treatment 3) comprising the steps of:
3-1) readying an aqueous solution of an ammonium-phosphate salt, or an aqueous solution of a metallic salt and an ammonium-phosphate salt;
3-2) mixing the aqueous solution with a material expressed by the aforementioned general formula; and
3-3) isolating the aforementioned material from a liquid obtained at said step 3-2); or (Treatment 4) comprising the steps of:

4-1) readying an acidic metallic salt aqueous solution, and an ammonium-phosphate salt aqueous solution, respectively;
4-2) mixing water with a material expressed by the aforementioned general formula;
4-3) mixing a liquid obtained at said step 4-2), said acidic metallic salt aqueous solution, and said ammonium-phosphate salt aqueous solution one another; and
4-4) isolating the aforementioned material from another liquid obtained at said step 4-3).

3. A lithium-ion secondary battery comprising the active material as set forth in claim 1.

4. The active material according to claim 1, wherein a first superlattice-structure portion exists in the superficial layer, the first superlattice-structure portion exhibiting a seven-set averaged value "n" of intensity ratios being less than 0.9 when the intensity ratios are computed in seven sets by dividing a minimum value of three continuous integrated intensities of an image, which is obtained by observing identical 3b sites in said lamellar rock-salt structure from a <1-100> orientation with a high-angle scattering annular dark-field scanning transmission electron microscope, by a maximum value of the three continuous integrated intensities.

5. The active material according to claim 1, wherein the lamellar rock-salt crystal structure comprises a heterogeneous stain $\eta_c$, in the crystalline c-axis direction and a heterogeneous strain η in the all-round direction.

6. An active material having a lamellar rock-salt structure, and expressed by a general formula, $Li_aNi_bCo_cMn_dD_eO_f$ (where 0.2≤"a"≤1, "b"+"c"+"d"+"e"=1, 0 ≤"e"<1, "D" is at least one element selected from the group consisting of Li, Fe, Cr, Cu, Zn, Ca, Mg, Zr, S, Si, Na, K and Al, and 1.7≤"f"≤2.1); and the active material comprising a first superlattice-structure portion in an active-material superficial layer thereof, the first superlattice-structure portion exhibiting a seven-set averaged value "n" of intensity ratios being less than 0.9 when the intensity ratios are computed in seven sets by dividing a minimum value of three continuous integrated intensities of an image, which is obtained by observing identical 3b sites in said lamellar rock-salt structure from a <1-100>orientation with a high-angle scattering annular dark-field scanning transmission electron microscope, by a maximum value of the three continuous integrated intensities.

\* \* \* \* \*